United States Patent [19]
Mihara et al.

[11] Patent Number: 4,893,158
[45] Date of Patent: Jan. 9, 1990

[54] MOSFET DEVICE

[75] Inventors: Teruyoshi Mihara, Yokosuka; Yukitsugu Hirota, Kamakura; Yukio Hiramoto, Tokyo; Tsutomu Matsushita, Yokohama, all of Japan

[73] Assignee: Nissan Motor Co., Ltd., Yokohama, Japan

[21] Appl. No.: 209,237

[22] Filed: Jun. 20, 1988

[30] Foreign Application Priority Data

Jun. 22, 1987 [JP] Japan .................................. 62-153479
Sep. 8, 1987 [JP] Japan .................................. 62-223018
Sep. 9, 1987 [JP] Japan .................................. 62-224063
Sep. 9, 1987 [JP] Japan .................................. 62-224064

[51] Int. Cl.$^4$ ........................................... H01L 29/78
[52] U.S. Cl. .................................. 357/23.13; 357/41; 357/35; 357/23.4; 357/51; 361/91
[58] Field of Search .................. 357/23.13, 23.4, 22, 357/51, 41, 34, 13, 35; 361/91, 56

[56] References Cited

U.S. PATENT DOCUMENTS 4,686,551 8/1987 Mihara ................................ 357/23.4

FOREIGN PATENT DOCUMENTS 0268249 5/1988 European Pat. Off. .
1764713 10/1971 Fed. Rep. of Germany .
59-98557 6/1984 Japan .

OTHER PUBLICATIONS

Wrathall, "The Design of a High Power Solid State Automotive Switch in CMOS-VDMOS Technology", IEEE, Power Electronic Specialists Conference Record, 1985, pp. 229-233.
S. Reich, "Vorspannungserzeugung bei MOS-Feldeffekttransistoren", Funk-Technik, (1971), pp. 201-204.

Primary Examiner—Andrew J. James
Assistant Examiner—Mark Prenty
Attorney, Agent, or Firm—Foley & Lardner, Schwartz, Jeffery, Schwaab, Mack, Blumenthal & Evans

[57] ABSTRACT

A power MOSFET is provided with a protective circuit including a monitor MOSFET whose drain is connected with the drain of the power MOSFET, a monitor resistor connected between the sources of the power and monitor MOSFETs, and a monitor transistor for decreasing a gate voltage of the power MOSFET when a voltage across the monitor resistor exceeds a predetermined level representing a dangerous condition of the device.

30 Claims, 26 Drawing Sheets

FIG. 35 *(PRIOR ART)*
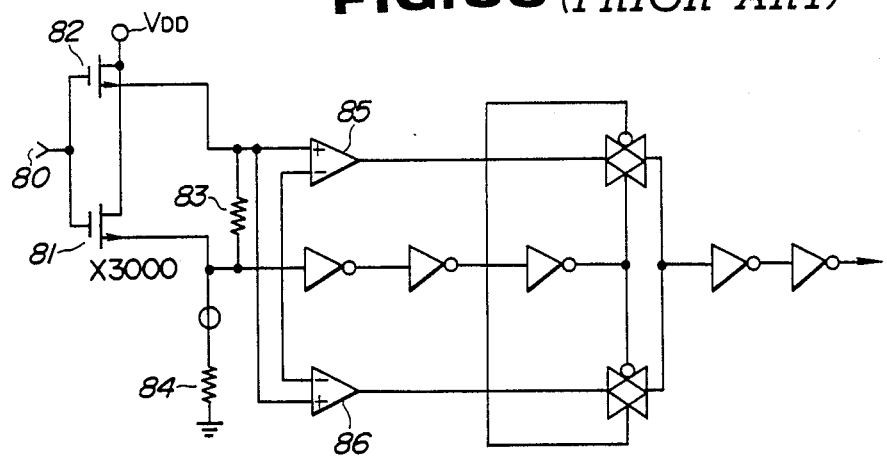
FIG. 36 *(PRIOR ART)*
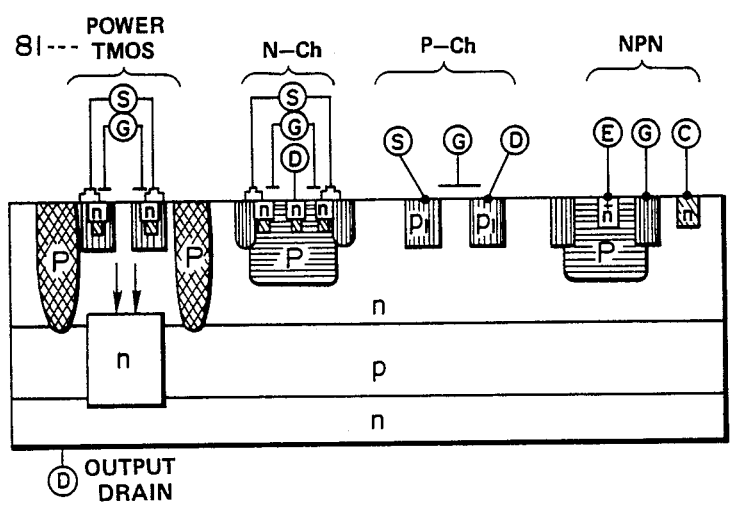

FIG. 37 *(PRIOR ART)*
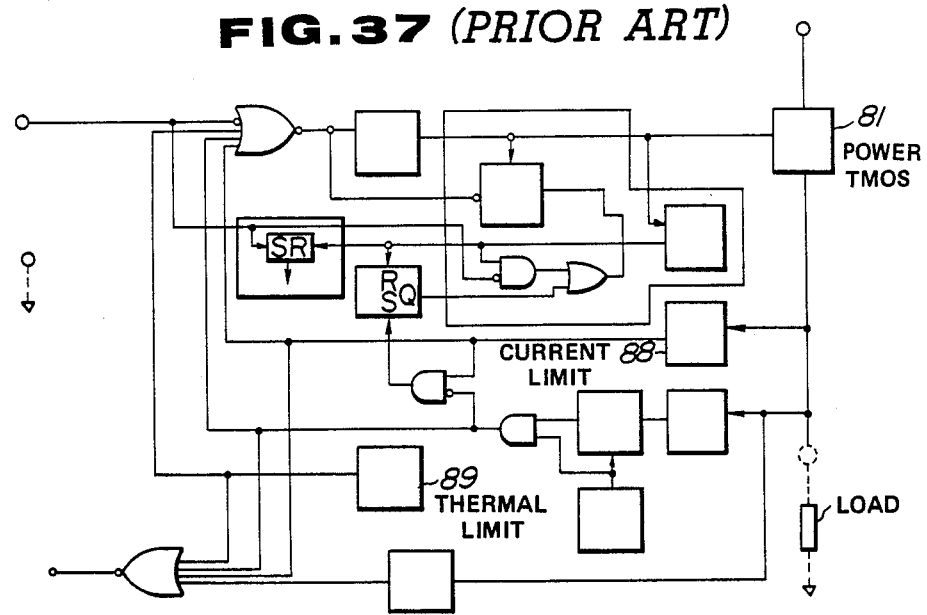
FIG. 38 *(PRIOR ART)*
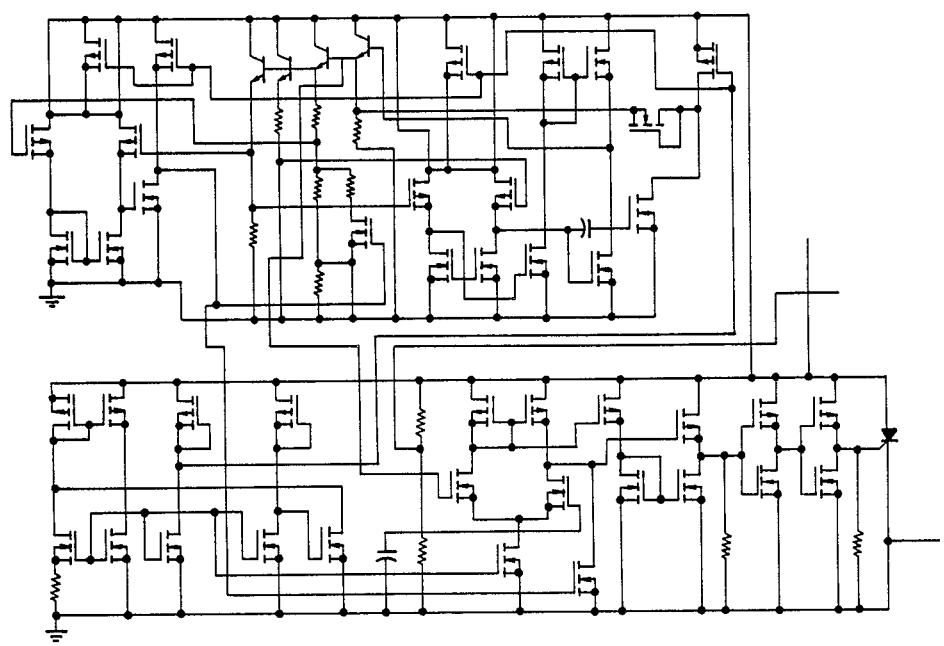

MOSFET DEVICE

BACKGROUND OF THE INVENTION

The present invention relates to a MOSFET device, and more specifically to an arrangement or structure suitable for protection of a power MOSFET against overcurrent or overheating.

FIGS. 35-38 show a conventional example of a vertical MOSFET device disclosed in IEEE Power Electronics Specialists Conference Record, 1985, pp 229.

FIG. 37 is a block diagram of the entire circuit of this device. A vertical power MOSFET is integrated with a protective circuit comprising CMOS and bipolar IC into a so-called power IC of a single chip. The device of FIG. 37 includes a thermal limit circuit 89 for detecting excessive temperature and a current limit circuit 88 for detecting excessive current. If an excessive condition is detected by the limit circuit 88 or 89, a signal is sent to a section of CMOS logic, and the power MOSFET 81 labeled as POWER TMOS is turned off to protect the device.

The current limit is shown in FIG. 35. The current limit has a single cell MOSFET 82 and a current sensing resistor 83. The MOSFET 82 consists of a single cell whereas the main MOSFET 81 consists of several thousand cells (3000 cells in this example) which are all connected in parallel. Therefore, the current through the main MOSFET 81 is 3000 times as large as the current through the single cell MOSFET 82.

A main current flowing through a load 84 is monitored by a current mirror circuit composed of the single cell MOSFET 82 and the current sensing resistor 83.

When the voltage drop across the current sensing resistor 83 is increased by an increase of the current flowing therethrough, either an upper rail comparator 85 or a lower rail comparator 86 produces an overcurrent detection signal. This signal is sent to a gate driving circuit, and causes the interruption of current. In this way, the current limit circuit prevents damage of the device due to overcurrent.

However, this MOSFET device is complicated in circuit configuration, and requires a wide variety of devices such a CMOS logic. Therefore, the size of a power IC chip is increased, the fabricating process is complicated, and the cost is high. Furthermore, this conventional device has not only the overcurrent protection but also other protective functions against excessive temperature and overvoltage, so that cost-utility is low in cases where only overcurrent protection is required.

FIG. 38 shows the thermal protection circuit of this conventional device. This circuit is arranged to detect a change of a base-emitter voltage of a bipolar transistor due to temperature change, and perform the protective function in accordance with the result of comparison with a reference voltage. However, in order to perform such a delicate analog control accurately, this circuit has a complicated and extensive configuration.

FIG. 36 is a cross section showing a basic structure of this conventional device. This structure requires a complicated and time-consuming fabrication process including two steps of epitaxial growths, and a step for forming a buried layer.

SUMMARY OF THE INVENTION

It is an object of the present invention to provide a MOSFET device having a protective function which is simple in arrangement, easy to fabricate, and low in cost.

It is another object of the present invention to provide a MOSFET device which can protect a power MOSFET in an effective manner well adapted to the area of safety operation (ASO) of the power MOSFET, with a very simple arrangement.

It is still another object of the present invention to provide a MOSFET IC structure which makes it possible to simplify a protective circuit of a power MOSFET without undesired influences.

According to one aspect of the present invention, a MOSFET device comprises a main MOSFET component having source, drain and gate electrodes, and a protective circuit. The protective circuit comprises first means for monitoring an operating condition of the main MOSFET component, such as a drain current, a drain-source voltage, or a temperature, and second means for turning off the main MOSFET component by decreasing a gate-source voltage if the operating condition exceeds a predetermined dangerous level.

Preferably, the protective circuit comprises a monitor MOSFET component, a monitor resistor, a first branch, and a protective transistor. The monitor MOSFET component has a gate electrode, a source electrode and a drain electrode which is connected with said drain electrode of the main MOSFET component. The monitor resistor is connected between the source electrodes of the main and monitor MOSFET components. The first branch connects the gate electrode of the main MOSFET component with the gate electrode of the monitor MOSFET component. The protective transistor has a first electrode directly connected with the gate electrode of the main MOSFET component, a second electrode and a control electrode connected with a node between said monitor resistor and said source electrode of said monitor MOSFET component.

The second electrode of the monitor MOSFET component is connected with the source electrode of the main MOSFET component, or a gate terminal of the MOSFET device, or some other point which enables the protective transistor to decrease a voltage applied to the gate electrode of the main MOSFET component when a voltage across the monitor resistor is increased.

BRIEF DESCRIPTION OF THE DRAWINGS

FIG. 35 is a schematic view showing an overcurrent protective circuit of a conventional device.

FIG. 36 is a cross section showing a basic structure of the conventional device.

FIG. 37 is a block diagram showing the conventional device.

FIG. 38 is a diagram showing a thermal protective circuit of the conventional device.

DETAILED DESCRIPTION OF THE INVENTION

A FIRST EMBODIMENT of the present invention is shown in FIGS. 1–5. A MOSFET device 101 of the first embodiment is provided with overcurrent protection.

Figure 1:
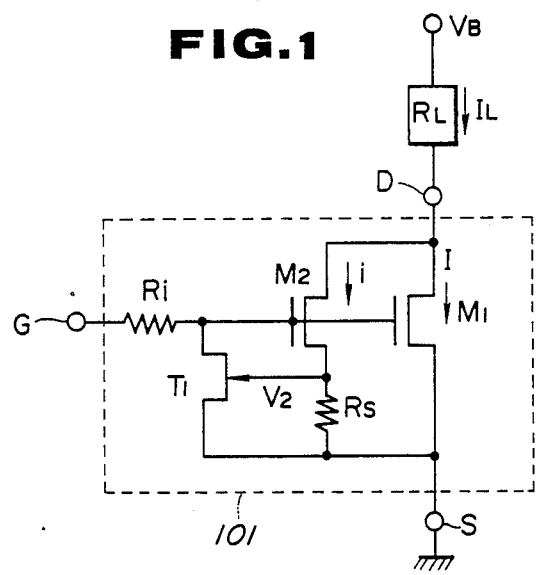
FIG. 1 is a circuit diagram sowing a MOSFET device of a first embodiment of the present invention.

As shown in FIG. 1, the MOSFET device 101 includes a main MOSFET component $M_1$ and a current mirror (or monitor) MOSFET component $M_2$. In this embodiment, the main MOSFET component $M_1$ is made up of several thousand cells which are all connected in parallel, while the current mirror MOSFET component $M_2$ is made up of a single cell which is substantially identical to the cells of the main MOSFET component $M_1$. A single MOS transistor is formed in each cell. Thus, the main MOSFET component $M_1$ is a collection of several thousand MOS transistors, all connected in parallel. It is possible to allot two or more cells to the current mirror MOSFET $M_2$. In any case, the number of the cell or cells of the current mirror MOSFET component $M_2$ is much smaller than the number of the cells of the main MOSFET component $M_1$.

The MOSFET device 101 further includes a current sensing (monitor) resistor Rs, an input resistor Ri, and a protective transistor $T_1$ for controlling the gate voltage of the main MOSFET $M_1$. In the first embodiment, the transistor $T_1$ is a metal gate FET(MESFET) or a junction FET(JFET).

The MOSFET device 101 has a gate terminal G, a drain terminal D and a source terminal S. In the first embodiment, a load $R_L$ is connected between the drain terminal D and a supply voltage $V_B$, and the source terminal S is grounded. Drain electrodes of the main and current mirror MOSFETs $M_1$ and $M_2$ are connected together and connected to the drainterminal D of the device 101. Gate electrodes of the main and current mirror MOSFETs $M_1$ and $M_2$ of the first embodiment are connected together and connected to a first branch point, which is connected with the gate terminal G through the input resistor Ri. The current sensing resistor Rs is connected between source electrodes of the main and current mirror MOSFETs $M_1$ and $M_2$. A drain electrode of the field effect transistor $T_1$ is connected with the first branch point. A source electrode of the transistor $T_1$ is connected with the source electrode of the main MOSFET $M_1$. A gate electrode of the transistor $T_1$ is connected with a second branch point lying between the current sensing resistor Rs and the source electrode of the current mirror MOSFET $M_2$. The source electrode of the main MOSFET $M_1$ is connected to the source terminal S of the device 100.

Figure 2A:
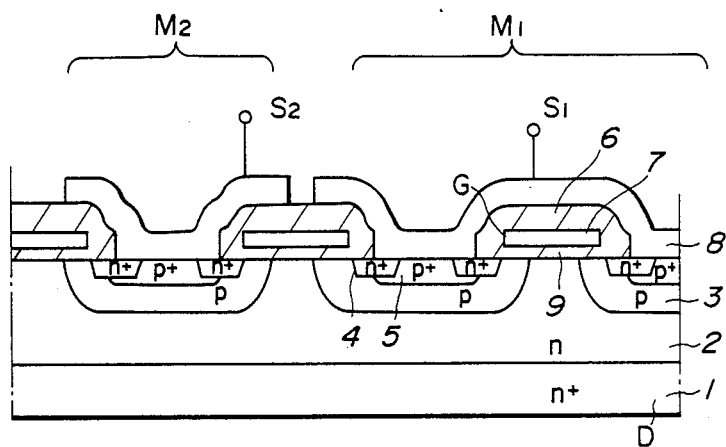
FIG. 2A is a cross section showing structures of MOSFETs shown in FIG. 1.

FIG. 2A shows the structures of the main and current mirror MOSFETs $M_1$ and $M_2$. Each of MOSFETs $M_1$ and $M_2$ is a vertical MOSFET in which a current flows upwardly from a bottom to a top of a semiconductor chip. As shown in FIG. 2A, a semiconductor substrate has an n+ lower substrate layer 1 in which the drain electrode common to M and $M_2$ is produced, and an n-type upper substrate layer 2 formed on the lower layer 1. Each cell which is a constituent of the main and current mirror MOSFETs $M_1$ and $M_2$ includes a p-type body region 3 formed in the n-type upper layer 2, at least one n+-type source region 4 formed in the body region 3, and a p+-type body contact region 5 formed in the body region 3. A gate insulating layer 9 of $SiO_2$ is formed on the top surface of the semiconductor substrate, and a polysilicon layer 7 serving as a gate electrode is formed on the gate insulating layer 9. The polysilicon layer 7 is covered with an upper insulating layer 6, and separated from a metal interconnection layer 8.

The cells are connected in parallel. Therefore, a load current $I_L$ flowing into the drain terminal of the device 101 is divided into a main current I flowing through the main MOSFET $M_1$ and a monitor current i flowing through the current mirror MOSFET $M_2$. The ratio of the monitor current i to the main current I is equal to the ratio of the number of the o cell or cells of the current mirror MOSFET $M_2$ to the number of the cells of the main MOSFET $M_1$.

Figure 2B:
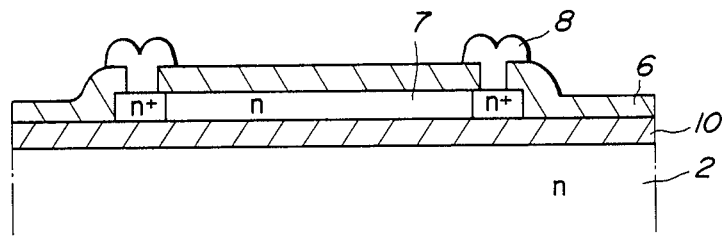
FIG. 2B is a cross section showing a structure of a resistor shown in FIG. 1.

FIG. 2B shows the structure of the input resistor Ri or the current sensing resistor Rs of the first embodiment. In this example, each of the input resistor Ri and the current sensing resistor Rs is a polysilicon resistor. In this embodiment, the input and current sensing resistors Ri and Rs are formed on the semiconductor substrate in which the MOSFETs $M_1$ and $M_2$ are formed. A field oxide layer 10 of $SiO_2$ is formed on the top surface of the semiconductor substrate, and a polysilicon layer 7 serving as the input or curent sensing resistor Ri or Rs is formed on the field oxide layer 10. In this embodiment, the input and current sensing resistors Ri and Rs are formed simultaneously with the polysilicon gate electrodes of the main and current mirror MOSFETs $M_1$ and $M_2$ by a single fabrication step. Accordingly, the fabrication process of the device can be simplified.

Figure 3:
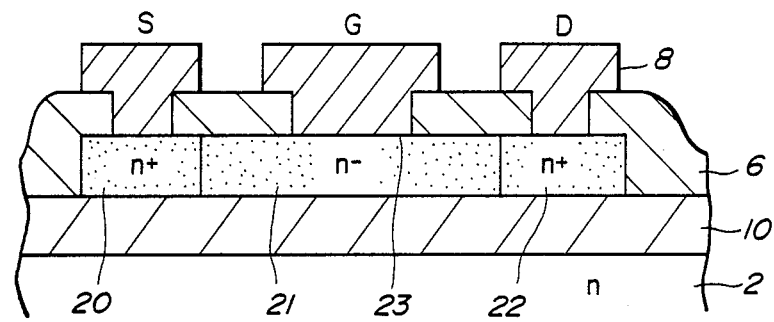
FIGS. 3 and 4 are cross sections showing two alternative structrures which can be employed as a protective transistor of FIG. 1.
Figure 4:
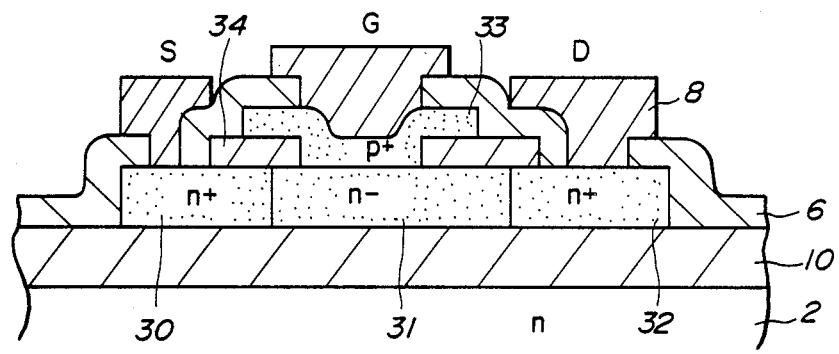

FIGS. 3 and 4 show, respectively, the structures of MESFET and JFET which can be used as the protective transistor T of the first embodiment. In either case, the protective transistor $T_1$ is in the form of a polysilicon film formed on an insulating layer. When the structure of FIG. 3 or 4 is employed, the protective transistor $T_1$ can be easily integrated with the remaining components of the device into a single IC, and a superior electrical isolation can be obtained without complicating the fabrication process.

The MESFET of FIG. 3 includes source and drain regions 20 and 22 of an $n^+$ type and an $n^-$-type channel region 21 which are all polysilicon regions formed in a polysilicon layer deposited on a field $SiO_2$ layer 10 corresponding to the field oxide layer 10 shown in FIG. 2. A Schottky junction 23 is formed between the $n^-$ channel region 21 and a metal gate electrode G. In the example of FIG. 3, a normally-off type (enhancement mode) transistor can be obtained by choosing the impurity concentration of the channel region 21 so that the channel 21 is entirely depleted at a built-in voltage of the Schottky diode 23. The normally-off transistor is advantageous because the driving current can be reduced during the normal operation during which the overcurrent protection is inoperative.

The structure of FIG. 3 can be fabricated simultaneously with the structures of FIGS. 2A and 2B without increasing the number of the fabrication steps. The polysilicon layer of FIG. 3 can be formed by the step of forming the polysilicon layers 7 shown in FIGS. 2A and 2B. The $n^+$ regions can be formed simultaneously by a single diffusion step. The metal gate electrode G of FIG. 3 can be formed simultaneously with the metal interconnection layer 8.

The JFET of FIG. 4 has a first polysilicon layer in which there are formed an $n^+$ source region 30, an $n^-$ channel region 31 and an $n^+$ drain region 32, and a second polysilicon layer forming a $p^+$-type gate region 33.

The JFET of FIG. 4 can be made into a normally-off type by choosing the impurity concentration and thickness of the channel region 31 so that the channel region 31 is completely depleted at a built-in voltage of a pn junction between the gate region 33 and the channel region 31.

Although the structure of FIG. 4 is somewhat complicated because of addition of the second polysilicon layer, it has the following advantage. When the pn junction of the gate is forward biased by application of a gate voltage, holes are injected from the gate region 33 into the channel region 31, so that conductivity modulation takes place in the channel region 31, decreasing the resistance of the channel region 31 of the polysilicon which originally has a high regisitivity. Therefore, it is possible to reduce the on resistance of the JFET, or to reduce the size of the JFET while holding the on resistance equal to that of the MESFET of FIG. 3.

Figure 5A:
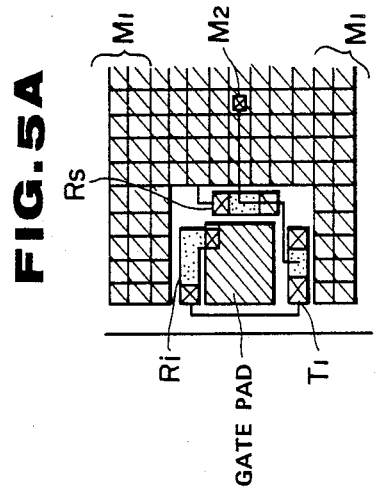
FIGS. 5A and 5B are, respectively, plan view and cross section showing the device of the first embodiment in the form of an IC.
Figure 5B:
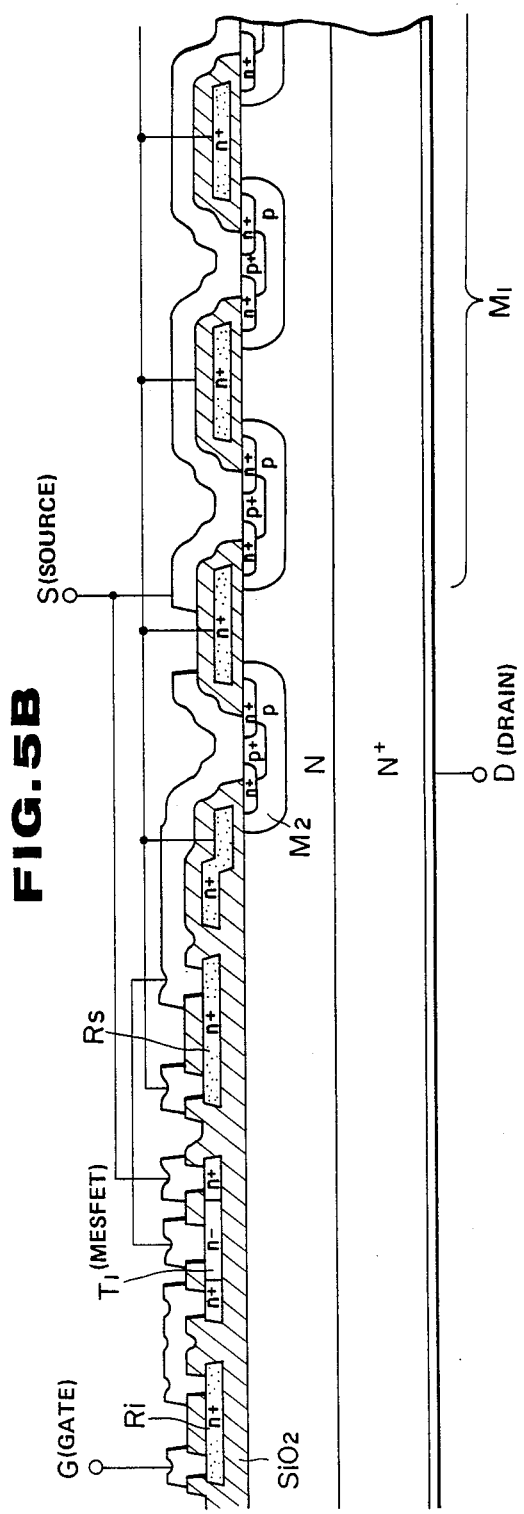

As shown in FIGS. 5A and 5B, the MOSFET device 101 of the first embodiment is in the form of an integrated circuit. In this example, the main and current mirror MOSFETs $M_1$ and $M_2$ having the structure shown in FIG. 2A, the input and current sessing resistors Ri and Rs each having the structure shown in FIG. 2B, and the MESFET shown in FIG. 3 are formed in and on the same n-type semiconductor substrate.

As shown in the plan view of FIG. 5A, the cells which are uniform in structure size are regularly arranged. In this example, only one belongs to the current mirror MOSFET $M_2$ and the others are connected in parallel to form the main MOSFET $M_1$.

In the IC of the first embodiment, it is possible to employ the JFET instead of the MESFET by replacing the MESFET in the structure of FIGS. 5A and 5B by the JFET of FIG. 4.

The MOSFET device 101 of the first embodiment is operated as follows:

When a voltage above a threshold voltage of the main and current mirror MOSFETs $M_1$ and $M_2$ is applied to the gate terminal G of the device 101 shown in FIG. 1, then the MOSFETs $M_1$ and $M_2$ are turned on, and the current $I_L$ flows through the load $R_L$. In this case, the ratio of the main current I flowing through the main MOSFET $M_1$ to the monitor current i flowing through the current mirror MOSFET $M_2$ is equal to the ratio of the number $n_1$ of the cells of the main MOSFET $M_1$ to the number $n_2$ of the cells of the current mirror MOSFET $M_2$. That is, $n_1:n_2=I:i$.

Because $I_L=I+i$, the load current $I_L$ is given by;

$$I_L = \frac{n_1 + n_2}{n_2} i$$

Therefore, it is possible to know the load current $I_L$ by sensing the monitor current i from the terminal voltage across the current sensing resistor Rs.

In case of accident such as short circuit of the load, an increase of the monitor current i causes an increase of the voltage across the current sensing resistor Rs. When the voltage across the current sensing resistor Rs exceeds a threshold voltage Vth of the protective transistor $T_1$, the transistor $T_1$ turns on, and limits the load current $I_L$ by decreasing the gate voltage of the main and current mirror MOSFETs $M_1$ and $M_2$.

From the above-mentioned relationship, the resistance of the current sensing resistor Rs required to limit the load current to a limit value $I_{lim}$ is given by;

$$Rs = \frac{n_1 + n_2}{n_2} \times \frac{Vth}{I_{lim}}$$

The value of Vth is given by Vth=Vbi−Vp where Vbi is a built-in voltage of the MESFET or JFET and Vp is a pichoff voltage which is the voltage at which the channel is completely depleted.

The pinchoff voltage Vp is given by;

$$Vp = qNt^2/2\epsilon_s$$

where t is the thickness of the channel 21 or 31, N is the impurity concentration of the channel, q is the electronic charge, and $\epsilon_s$ is the dielectric constant of silicon. Therefore, it is possible to control the threshold voltage Vth by controlling the impurity concentration N and thickness t of the channel.

The built-in voltage Vbi of each of the MESFET and JFET is only 1 V or less. Therefore, it is possible to obtain the normally-off type FET whose threshold voltage Vth=0∼1 V. By lowering the threshold voltage Vth, it is made possible to decrease the value of the current sensing resistor Rs, so that the accuracy of the current mirror operation can be improved.

Thus, in the present invention, the number of required components is small, and the fabrication process is simplified.

Figure 6:
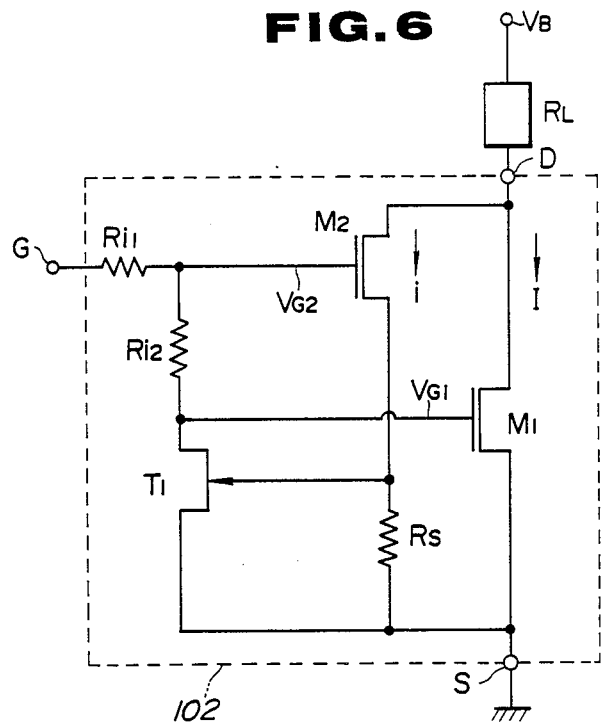
FIG. 6 is a circuit diagram showing a MOSFET device of a second embodiment of the present invention.

A SECOND EMBODIMENT of the present invention is shown in FIG. 6. A device 102 of the second embodiment is a MOSFET device including all the circuit components of the first embodiment device 101. However, the MOSFET device 102 of the second embodiment is different from the first embodiment device 101 in the addition of a second input resistor $Ri_2$ interposed between the gate electrode of the main MOSFET $M_1$ and the gate electrode of the current mirror MOSFET $M_2$. By separating the gate electrodes of the MOSFETs $M_1$ and $M_2$, the second input resistor $Ri_2$ allows the MOSFETs $M_1$ and $M_2$ to operate separately, during turn-on of the protective transistor $T_1$. With this second input resistor $Ri_2$, the MOSFET device 102 of the second embodiment is arranged so that the main MOSFET $M_1$ is completely cut off when an overcurrent is detected.

When the current sensing resistor Rs of FIG. 6 detects an overcurrent, the protective transistor $T_1$ consisting of the MESFET or JFET turns on. In this case, a gate voltage $V_{G1}$ of the main MOSFET $M_1$ whose gate is connected with the drain of the protective transistor $T_1$ is immediately reduced to zero volt, so that the main MOSFET $M_1$ cuts off the current path.

On the other hand, a gate voltage $V_{G2}$ of the current mirror MOSFET $M_2$ remains almost unchanged because of interposition of the second input resistor $Ri_2$ whose value is so chosen that $Ri_2$ is much greater than the resistance value of the first input resistor $Ri_1$ corresponding to the input resistor of the first embodiment (i.e. $Ri_2 >> Ri_1$). Therefore, the current mirror MOSFET $M_2$ remains on, and holds the terminal voltage across the current sensing resistor Rs above the threshold voltage of the transistor $T_1$. As a result, the protective transistor $T_1$ continues to be on, and accordingly the main MOSFET $M_1$ continues to be off.

In the first embodiment device 101 arranged to limit the current to the limit value $I_{lim}$ on the occurrent of overcurrent, the power MOSFET consumes electric power of $V_{DS} \times I_{lim}$. Because the drain-source voltage $V_{DS}$ normally becomes excessively high for the limit current value $I_{lim}$ which is higher than a design current, and the limit current $I_{lim}$ is greater than the normal working current, this power consumption given by the product of $V_{DS}$ and $I_{lim}$ becomes considerably higher than the power consumption during normal operation, and causes such an increase in the temperature of the device that a radiating plate or other cooling means is required in some cases. In contrast, the device 102 of the second embodiment can provide not only overcurrent protection but also protection against overheating due to overcurrent by completely cutting off the main MOSFET $M_1$ when once the current exceeds the limit value $I_{lim}$. Therefore, the second embodiment can eliminate, or reduce the size of, the radiating plate.

It is possible to form the MOSFET device 102 of the second embodiment into an integrated circuit in the same manner as the device 101 of the first embodiment by using the structures shown in FIGS. 2A–5B.

Figure 7:
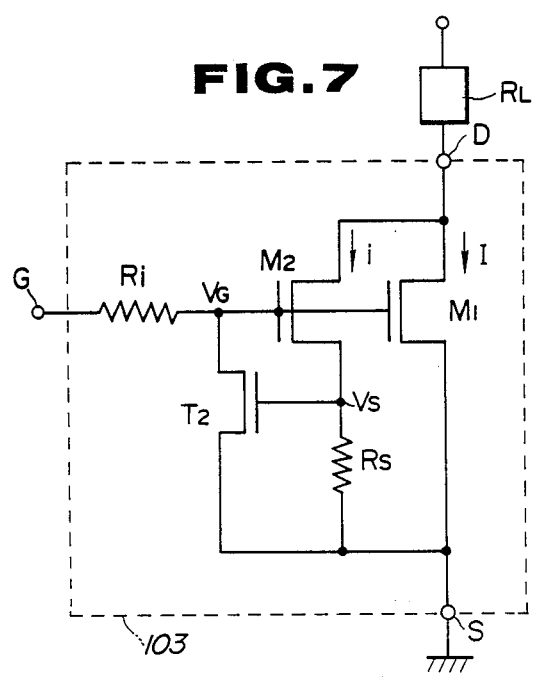
FIG. 7 is a circuit diagram showing a MOSFET device of a third embodiment.
Figure 8:
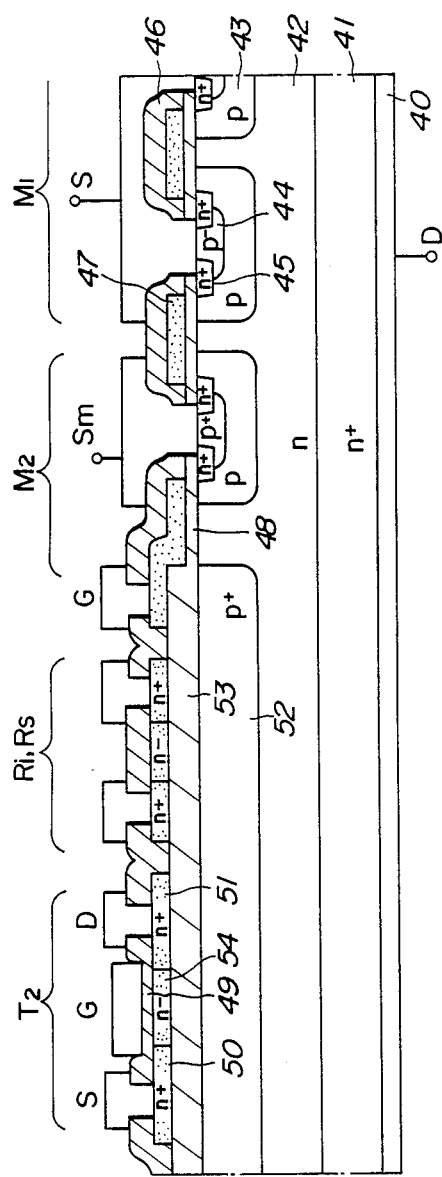
FIG. 8 is a cross section showing a structure of the device of FIG. 7.

A THIRD EMBODIMENT of the present invention is shown in FIGS. 7 and 8. A MOSFET device 103 of the third embodiment is almost the same as the first embodiment device 101. In the third embodiment, however, an n channel MOSFET is used as a protective transistor $T_2$ corresponding to the transistor $T_1$ of the first embodiment. In the third embodiment, this n channel MOSFET $T_2$, current sensing resistor Rs and input resistor Ri are all made of polysilicon.

The circuit of FIG. 7 is different from the circuit of FIG. 1 only in that the n channel MOSFET $T_2$ is substituted for the transistor $T_1$.

Although the device 103 of the third embodiment may be in the form of a conventional circuit consisting of discrete devices, it is easy to built all the components of the devices 103 into a single chip by employing the structure shown in FIG. 8.

The main and current mirror MOSFETs $M_1$ and $M_2$ are of the vertical type, and have a common drain electrode 40 connected directly to an n+ lower layer 41 of a semiconductor substrate. A p body region 43 of each cell is formed in an n upper layer 42 of the substrate. A polysilicon gate electrode 47 is formed above the body region 43, and insulated from the semiconductor surface by a gate SiO$_2$ layer 48. At least one n+ source region 45 is formed in the body region 43. A p+ body contact region 44 is formed in the body region 43. The gate electrode 47 is covered with a PSG layer 46.

The current sensing resistor Rs and input resistor Ri are polysilicon resistors formed simultaneously with the polysilicon gate electrodes 47. The n channel MOSFET $T_2$ of this example is a polysilicon TFT formed on a field SiO$_2$ film 53. The polysilicon film of $T_2$ can be also formed simultaneously with the gate electrodes 47. A gate SiO$_2$ layer 49 is formed on an n− polysilicon channel region 54 of $T_2$, and an Al gate electrode G is formed on the gate SiO$_2$ layer 49. On both sides of the channel region 54, there are formed n+ polysilicon source and drain regions 50 and 51. A p+ guard ring region 52 is formed in the upper layer 42 under the field SiO$_2$ layer 53.

The protecive transistor $T_2$ of the third embodiment is formed into a so-called accumulation type MOSFET structure having a doping configuration of $n^+ - n^- - n^+$ in order to decrease the threshold voltage as much as possible.

Each of the resistors Rs and Ri and the transistor $T_2$ has a so-called SOI structure, so that a superior electrical isolation can be obtained, and the entire structure can be simplified.

Figure 9:
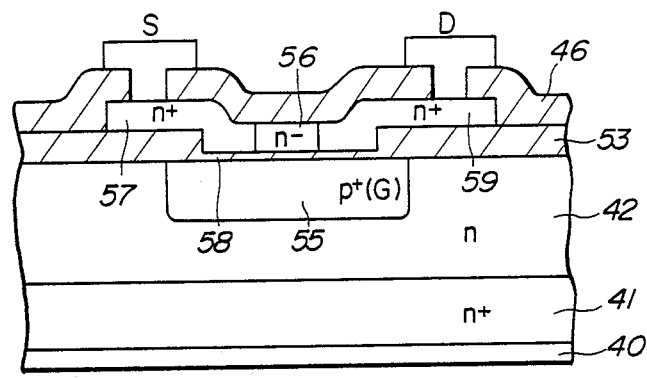
FIG. 9 is a cross section showing an alternative form of an n channel MOSFET $T_2$ shown in FIG. 7.

FIG. 9 shows another example of the structure of the n channel MOSFET $T_2$. The example of FIG. 9 is also a polysilicon TFT. In the example of FIG. 9, a gate $SiO_2$ layer 58 is an insulating layer formed on the top surface of the semiconductor substrate simultaneously with the gate insulating layers of the vertical MOSFETs $M_1$ and $M_2$. A $p^+$ gate diffusion region 55 is formed in the n upper layer 42 of the substrate under the gate insulating layer 58. The polysilicon layer of $T_2$ includes an $n^-$ channel region 56, and $n^+$-type source and drain regions 57 and 59.

In the device 103 of the third embodiment, an increase of the terminal voltage Vs of the current sensing resistor Rs caused by an increase of the monitor current i due to short circuit causes a decrease of the on resistance of the n channel MOSFET $T_2$, and a consequent decrease of the gate volta $V_G$ of the main and current mirror MOSFETs $M_1$ and $M_2$.

Figure 10:
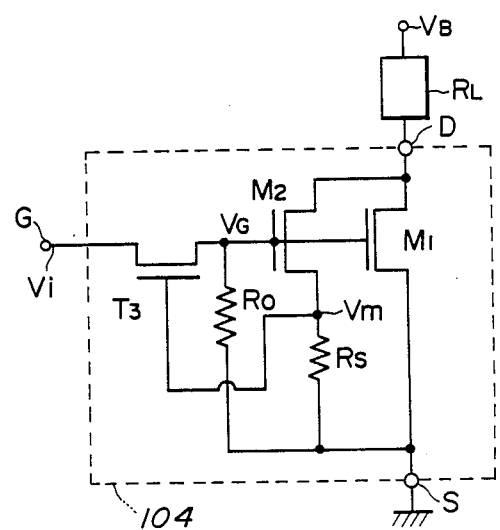
FIG. 10 is a circuit diagram showing a MOSFET device of a fourth embodiment.
Figure 11:
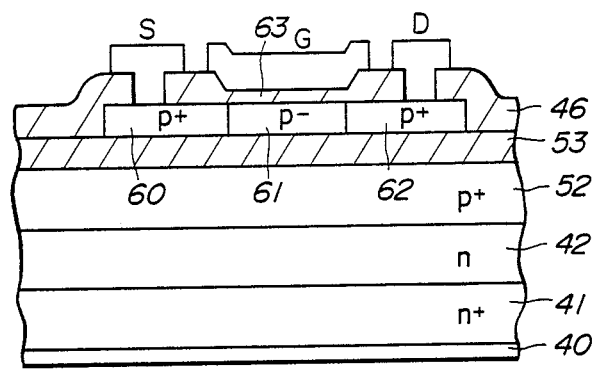
FIGS. 11 and 12 are cross sections showing two alternative structures of a p channel MOSFET $T_3$ used in the fourth embodiment.

A FOURTH EMBODIMENT of the present invention is shown in FIGS. 10 and 11. A MOSFET device 104 of the fourth embodiment is arranged to achieve the current limit for overcurrent protection with a p channel MOSFET $T_3$.

As shown in FIG. 10, the p channel MOSFET $T_3$ is connected in series with the gates of the main and current mirror MOSFET $M_1$ and $M_2$. The gate of the p channel MOSFET $T_3$ is connected to a branch point between the current mirror MOSFET $M_2$ and the current sensing resistor Rs. Another resistor Ro is interposed between the source terminal S and a branch point between the p channel MOSFET $T_3$ and the gates of the main and current mirror MOSFET $M_1$ and $M_2$.

In the device 104 of FIG. 10, an increase of the terminal voltage Vm of the current sensing resistor Rs due to overcurrent causes an increase of the on resistance of the p channel MOSFET $T_3$, which, in turn, causes a decrease of the gate voltage $V_G$ of the main and current mirror MOSFET $M_1$ and $M_2$ to limit the overcurrent.

Figure 12:
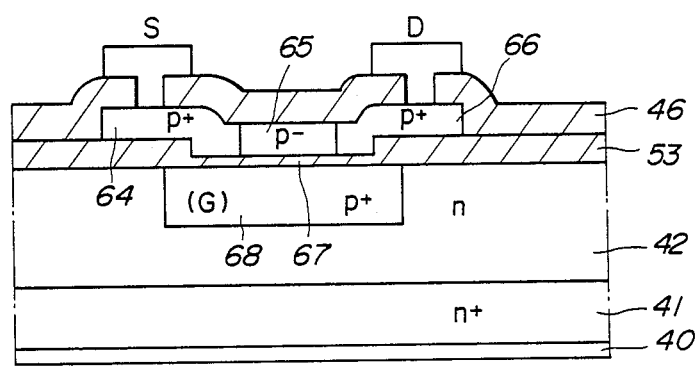

The main and current mirror MOSFETs $M_1$ and $M_2$, and the resistors Rs and Ro of the fourth embodiment are constructed in the same manner as shown in FIG. 8. THe p channel MOSFET $T_3$ is constructed as shown in FIGS. 11 or 12. Except that the conductivity type is opposite in each region of the polysilicon layer, the structure of FIG. 11 is similar to the structure of $T_2$ shown in FIGS. 8, and the structure of FIG. 12 is similar to the structure of FIG. 9. In the example of FIG. 11, the polysilicon layer has a $p^-$-type channel region 61 and $p^+$-type source and drain regions 60 and 62, and a gate $SiO_2$ layer 63 is formed on the polysilicon layer. In the example of FIG. 12, the polysilicon layer includes a $p^-$-type channel region 65, and $p^+$-type source and drain regions 64 and 66, and a $p^+$-type diffusion gate region 68 is formed in the n upper layer 42 under a gate $SiO_2$ layer 67.

Each of the preceding embodiments is advantageous in that the fabricating process is simple and easy, and the number of required circuit components is small, so that the components can be easily integrated into a single chip of a small size.

Figure 13:
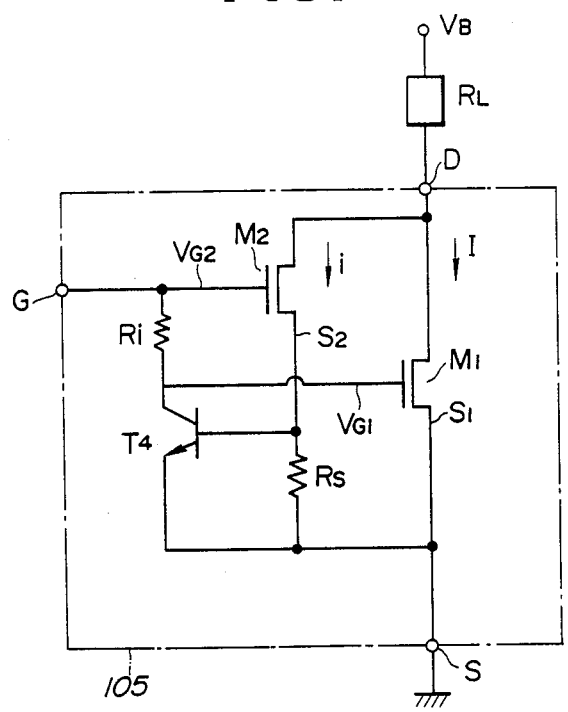
FIG. 13 is a circuit diagram showing a MOSFET device of a fifth embodiment.
Figure 15:
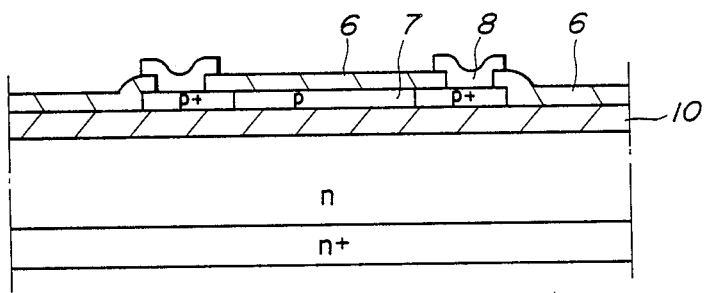
FIGS. 15 and 16 are cross sections showing, respectively, structures of a resistor, and a bipolar transistor $T_4$ of the fifth embodiment.

A FIFTH EMBODIMENT of the present invention is shown in FIGS. 13-15. A MOSFET device 105 of the fifth embodiment is similar to the second embodiment device 102 shown in FIG. 6 in that the input resistor Ri is interposed between the gates of the main an current mirror MOSFETs $M_1$ and $M_2$. However, the fifth embodiment device 105 differs from the second embodiment device 102 in that the protective transistor for limiting the gate voltage $V_{G1}$ of the main MOSFET $M_1$ is a bipolar transistor $T_4$.

Figure 14A:
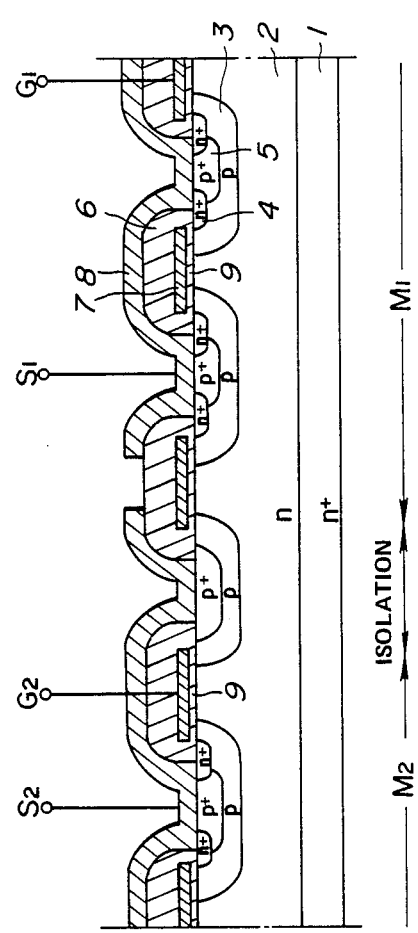
FIGS. 14A and 14B are cross section and schematic plan view showing structures of MOSFETs $M_1$ and $M_2$ shown in FIG. 13.
Figure 14B:
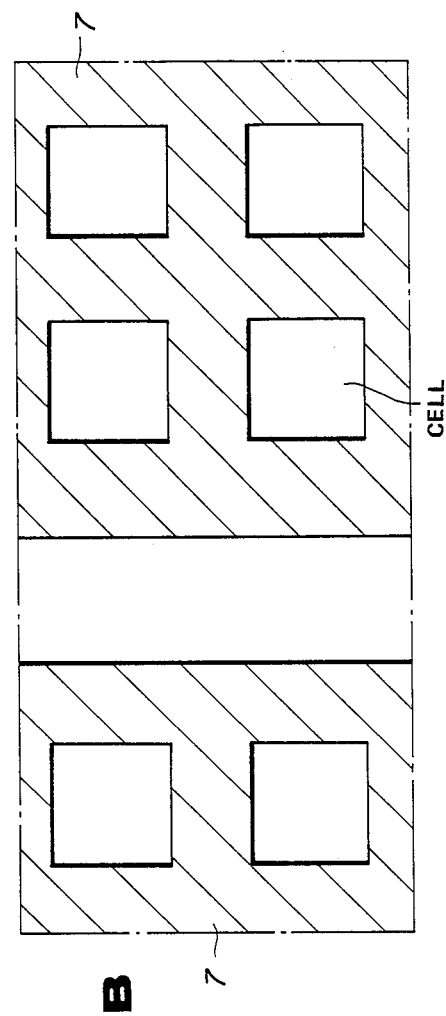

The structures of the main and current mirror MOSFETs $M_1$ and $M_2$ shown in FIG. 14A are similar to those of the preceding embodiments. The main and current mirror MOSFETs $M_1$ and $M_2$ are separated from each other by an isolation region as shown in FIGS. 14A and 14B. FIG. 14B shows only the polysilicon layer 7 used as the gate electrodes of the main and current mirror MOSFETs $M_1$ and $M_2$. In the example of FIG. 14B, the current mirror MOSFET $M_2$ includes more than one cell. In each of $M_1$ and $M_2$, the cells are regularly arranged.

FIG. 15 shows a polysilicon resistor used as the input and current sensing resistors Ri and Rs. A polysilicon layer 7 shown in FIG. 15 is formed on the field oxide layer 10 simultaneously with the polysilicon layer 7 shown in FIGS. 14A and 14B. Doping to the polysilicon layer 7 of FIG. 15 can be performed by the steps for forming the p body regions 3 and $p^+$ body contact regions 5 of $M_1$ and $M_2$, or by the step for forming the $n^+$ source regions 4.

Figure 16:
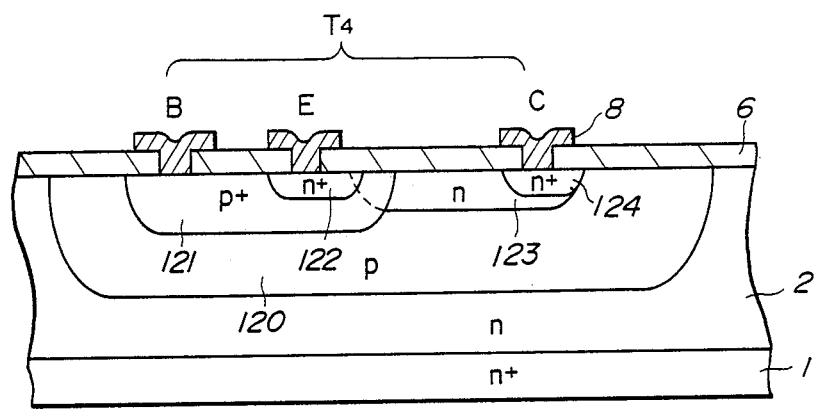

FIG. 16 shows the bipolar transistor $T_4$. A p-type first base region 120 is formed in the n-type upper substrate layer 2 of the semiconductor substrate, simultaneously with the p body regions 3 of main and current mirror MOSFETs $M_1$ and $M_2$. The bipolar transistor $T_4$ further includes a $p^+$ second base region 121 and an $n^+$ emitter region 122. The impurity concentration of the second base region 121 is higher than that of the first base region 120. The second base region 121 is formed in the first base region 120 by the step for forming the $p^+$ body regions of $M_1$ and $M_2$. The emitter region 122 is formed in the second base region 121 by the step for forming the $n^+$ source regions 4 of $M_1$ and $M_2$.

The second base region 121 and the emitter region 122 are formed by the technique of Diffusion Self Alignment (DSA) using the same mask, in order to reduce a base width of the bipolar transistor $T_4$ formed in the lateral direction at or near the semiconductor substrate surface. A part of the second base region 121 is cut by forming an n-type collector region 123 after the second base region 121 has been formed. Therefore, it is possible to obtain a high $h_{FE}$ by lowering the impurity concentration of the base and reducing the base width of the lateral transistor $T_4$.

The fifth embodiment can simplify the fabrication process of the MOSFET device by eliminating the necessity of a CMOS logic and a complicated bipolar transistor structure, and facilitate the reduction of the chip size in the same as in the preceding embodiments.

The bipolar transistor $T_4$ of the fifth embodiment is operated as follows:

The main and current mirror MOSFETs $M_1$ and $M_2$ are both turned on, and the load current $I_L$ is caused to flow through the load $R_L$ by application to the gate terminal G of the device 105, of a voltage $V_G$ above the threshold voltage Vth of the MOSFETs $M_1$ and $M_2$. During normal operation, the bipolar transistor $T_4$ remains off, so that $V_G = V_{G1} = V_{G2}$, and $n_1:n_2 = I:i$. Therefore, the load current $I_L$ which is equal to the sum of I and i is given by;

$$I_L = \frac{n_1 + n_2}{n_2} \cdot i$$

Therefore, the voltage Vs developed between both ends of the current sensing resistor Rs (Vs=Rs×i) is proportional to the load current $I_L$.

This device is so designed that, during normal operation, the voltage Vs across the resistor Rs remains lower than a threshold value $V_{BE}$ ($\approx$0.6 V) Of the base-emitter voltage of the bipolar transistor T4. Therefore, the bipolar transistor T4 is held off, and ensures the above-mentioned current mirror operation by maintaining the relationship $V_G = V_{G1} = V_{G2}$.

When the load current $I_L$ is increased by a short circuit of the load or some other accident, the monitor current i increases in proportion to the load current $I_L$. If the voltage Vs across the current sensing resistor Rs is increased by the increase of the monitor current i beyond the base-emitter voltage $V_{BE}$=0.6 V of the bipolr transistor T4, then the transistor T4 is turned on, and the gate voltage $V_{G1}$ of the main MOSFET M1 is decreased. Thus, the gate voltage $V_{G1}$ becomes lower than $V_{G2}$ ($V_G = V_{G2} > V_{G1}$).

In order to limit the load current $I_L$ to a limit value $I_{lim}$, the value of the current sensing resistor Rs is set as;

$$Rs = \frac{n_1 + n_2}{n_2} \times \frac{V_{BE}}{I_{lim}}$$

Therefore, the bipolar transistor T4 can limit the load current $I_L$ to the value $I_{lim}$ by turning on at the current value $I_{lim}$.

When the gate voltage $V_{G1}$ of M1 is lower than the gate voltage $V_{G2}$ of M2, the principle of current mirror does not hold any more because of inequality between $V_{G1}$ and $V_{G2}$. In the main MOSET M1, a decrease of the gate voltage $V_{G1}$ causes a steep increase of the on resistance Ron of th main MOSFET M1. Therefore, the drain-source voltage $V_{DS}$ increases notwithstanding the decrease of the main current I ($\approx I_L$) through M1. The drain-source volta is given by;

$$V_{DS} = I_L \times Ron \left( = V_B \times \frac{Ron}{R_L + Ron} \right)$$

On the other hand, the gate voltage $V_{G2}$ of the current mirror MOSFET M2 remains equal to $V_G$. Therefore, the monitor current i through M2 increases because of an increase of $V_D$. Thus, the monitor current i through M2 increases whereas the main current I decreases. Therefore, the voltage Vs across the current sensing resistor Rs is further increased. This increase of Vs strengthens the on state of the bipolar transistor T4, and further decreases the gate voltage VG1 of M1 in the manner of positive feedback. Finally, the gate voltage $V_{G1}$ of M1 becomes lower than the threshold voltage Vth, and the main MOSFET M is cut off, so that no or little current flows through M1. In this way, the bipolar transistor T4 protects the main MOSFET M1 if an overcurrent once exceeds the limit value $I_{lim}$. The arrangement of the fifth embodiment can prevent an excessive increase of the junction temperature and avoid the possibility of thermal runaway by reducing the current through the main MOSFET M1 to almost zero in the same manner as in the second embodiment.

The polysilicon film resistor shown in FIG. 15 is stable against temperature increase, and superior in electrical isolation from M1 and M2.

The bipolar transistor T4 of the fifth embodiment can serve in a stable manner as a comparator for detecting an overcurrent because it is formed by the DSA technique which makes it possible to reduce the base width to a very small value.

Figure 17:
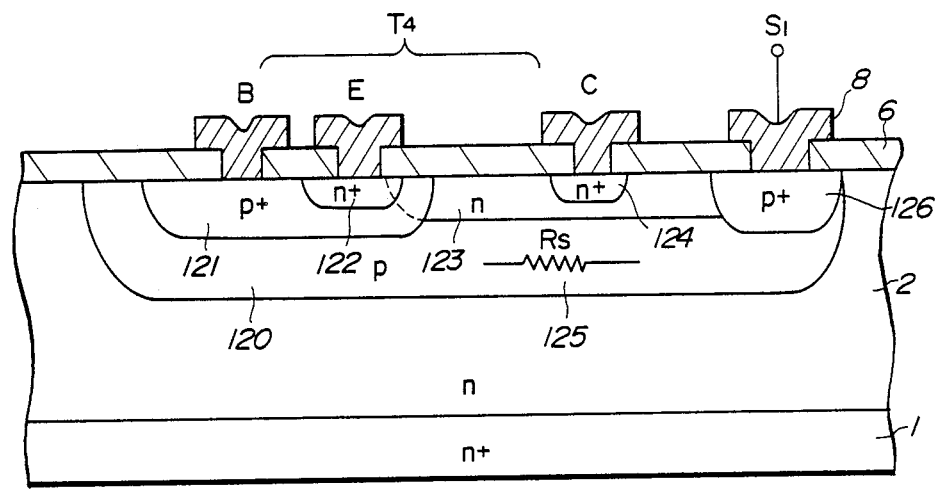
FIG. 17 is a cross section showing a modification of the fifth embodiment.

FIG. 17 shows a modification of the fifth embodiment device. The modification of FIG. 17 is different from the structure of FIG. 16 only in that a pinch region 125 under the collector region 123 is used as the current sensing resistor Rs. The structure of FIG. 17 utilizes a portion of the p-type first base region 120 having a high resistivity as a pinch resistor, so that the chip size can be further reduced.

Figure 18:
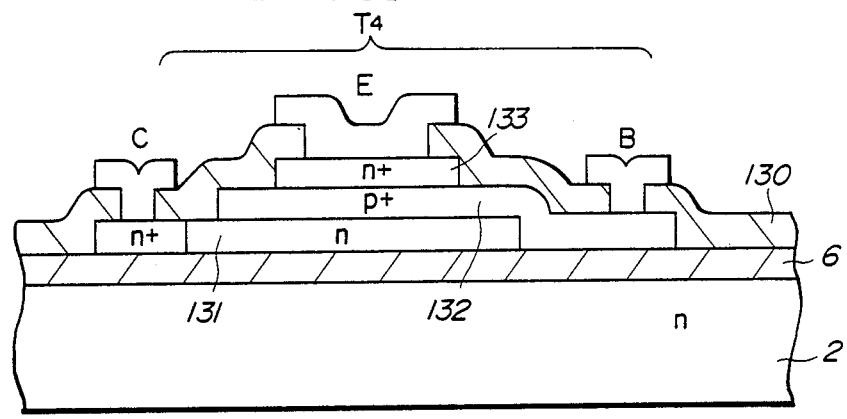
FIG. 18 is a cross section showing another structure of the bipolar transistor $T_4$.
Figure 19A:
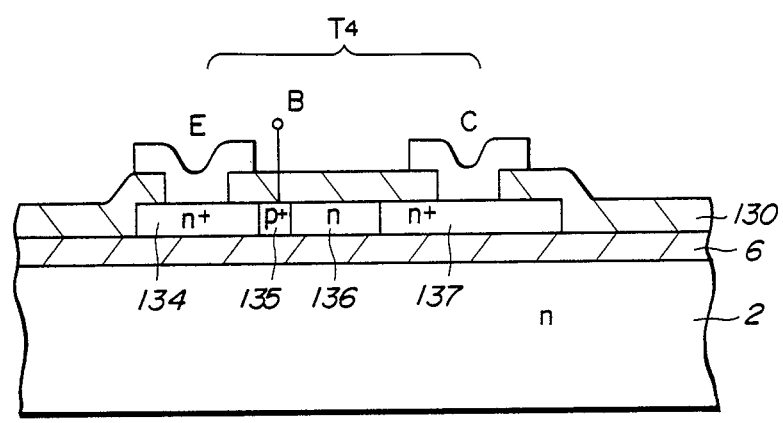
FIGS. 19A and 19B are cross section and plan view showing still another structure of the bipolar transistor $T_4$.
Figure 19B:
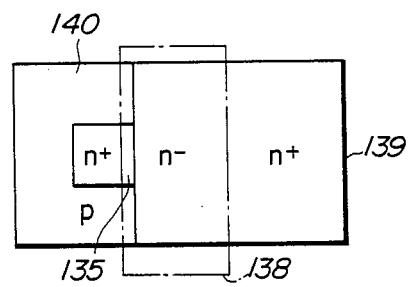

The bipolar transistor T4 of the fifth embodiment may be in the form of a three layer npn polysilicon transistor shown in FIG. 18 or in the form of a single layer polysilicon transistor shown in FIGS. 19A and 19B, instead of the structure of FIG. 16.

Polysilicon has many traps in grain boundaries. In a typical example, therefore, the diffusion length of electrons which are minority carriers is from several thousand angstroms to one micrometer. It is possible to use the polysilicon safely when the base width is made as small as the level of such a diffusion length. Even though a transistor structure has $h_{FE}$ smaller than one, the structure is usable if the output impedance of T4 is sufficiently low as compared with the input resistor Ri.

The structure of FIG. 18 has a first polysilicon layer in which an n-type collector region 131 is formed, a second polysilicon layer in which a p+ base region 132 is formed, and a third polysilicon layer in which an n+ emitter region 133 is formed. The first layer is formed on the insulating layer formed on the top surface of the semiconductor substrate. The second layer is formed on the first layer, and the third layer is on the second layer. There is further provided a PSG layer 130. In this example, the thickness of each of the collector region 131 and the emitter region 133 approximately equals 1 micrometer, and the thickness of the base region 132 approximately equals 5000 Å (angstrom).

In order to prevent interlayer diffusion of impurities among the three polysilicon layers, it is advisable to form these polysilicon layers by deposition such as LPCVD after the formation of the vertical MOSFETs M1 and M2.

The three layer structure of FIG. 18 is somewhat disadvantageous in that the number of fabrication steps is slightly increased. However, this structure is superior in performance because there is formed no parasitic bipolar transistor at all.

The bipolar transistor of FIGS. 19A and 19B is formed in a single polysilicon layer, so that the fabrication process is simplified as compared with the structure of FIG. 18.

The structure of FIGS. 19A and 19B has an n+ emitter region 134, a p+ base region 135, an n collector region 36 and an n+ collector region 137, which are all formed in a polysilicon layer 139 formed on the insulating layer on the semiconductor substrate.

In this example, the base width is reduced by DSA technique. Diffusion of the base region 135 and diffusion of the emitter region 134 are performed successively by using the same diffusion mask of a thick SiO$_2$ layer or the like. The base width is controlled to a small value by a difference between both diffusions. In FIG. 19B, the DSA mask is denoted by a numeral 138. A numeral 40 denotes a lead region of the base region 135. A base electrode is provided in this lead region 140.

The device of FIGS. 19A and 19B is a lateral type, so that this device requires a larger size than the example of FIG. 18 in order to obtain the same driving ability. However, the structure of FIGS. 19A and 19B is easy to fabricate, and completely free from parasitic bipolar transistor because of its SOI structure.

Figure 20:
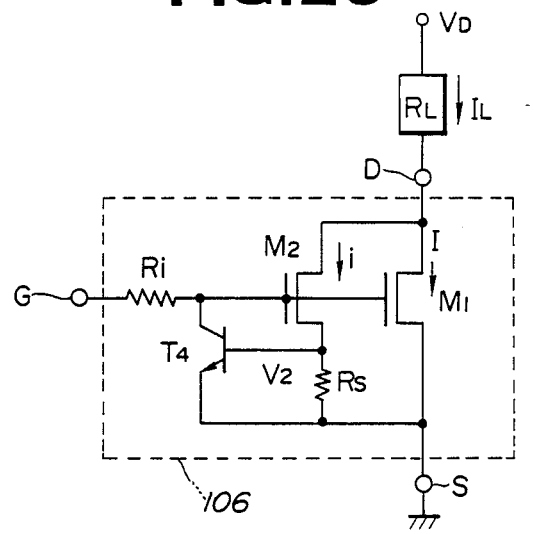
FIG. 20 is a circuit diagram showing a MOSFET device of a sixth embodiment.
Figure 21:
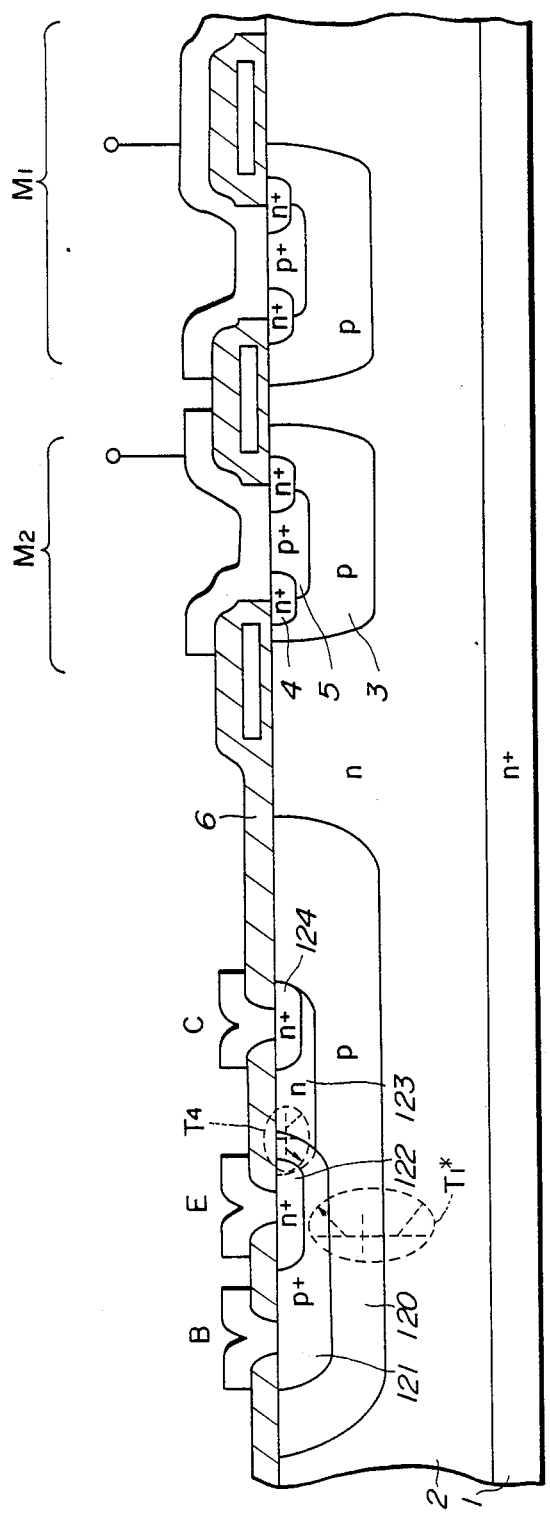
FIG. 21 is a cross section of the device of the sixth embodiment.

A SIXTH EMBODIMENT of the present invention is shown in FIGS. 20 and 21. The sixth embodiment is identical to the fifth embodiment in that the bipolar transistor T$_4$ is employed as the protective transistor for controlling the gate voltage of the main MOSFET M$_1$. In the sixth embodiment, however, the gates of the main and current mirror MOSFETs M$_1$ and M$_2$ are connected together as in the first embodiment.

As shown in FIG. 21, the bipolar transistor T$_4$ having the same structure as shown in FIG. 16 is integrated with the main and current mirror MOSFETs M$_1$ and M$_2$. The bipolar transistor T$_4$ of FIG. 21 is formed in the same manner as the structure of FIG. 16.

The p-type first base region 120 is formed in the n upper substrate layer 2 simultaneously with the p body regions 3 of M$_1$ and M$_2$ by the same process. The p+ second base region 121 is formed in the first base region 120, simultaneously with the p+ body contact regions 5 of M$_1$ and M$_2$ by the same process. The n+ emitter region 122 is formed simultaneously with the n+ source regions 4 of M$_1$ and M$_2$.

In order to reduce the base width of the lateral type bipolar transistor T$_4$, the second base region 121 and the emitter region 122 are formed by diffusion (Diffusion Self Alignment) using the same mask. A part of the second base region 121 is cut by forming the collector region 123 after formation of the second base region 121. By this process, it is possible to obtain a high h$_{FE}$ by reducing the base width and lowering the impurity concentration of the base of the lateral bipolar transistor T$_4$.

In the structure of FIG. 21, there is formed a parasitic bipolar transistor T$_1$* in the vertical direction, as shown in FIG. 21. However, the base width of this parasitic transistor T$_1$* is considerably larger than that of the lateral transistor T$_4$. Furthermore, it is possible to reduce h$_{FE}$ of the parasitic transistor T$_1$* to a negligible value because the impurity concentration of the second base region 121 is high. Therefore, the structure of T$_4$ shown in FIGS. 16 and 21 can prevent undesired influences of the parasitic bipolar transistor.

Figure 22:
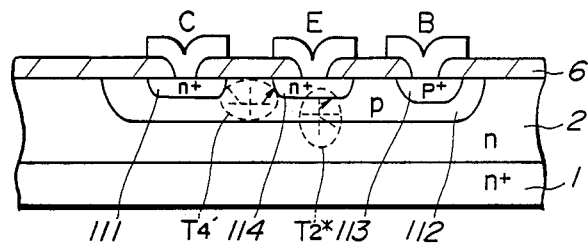
FIGS. 22 and 23 are cross section and circuit diagram showing an example in which the structure of the present invention is not used.
Figure 23:
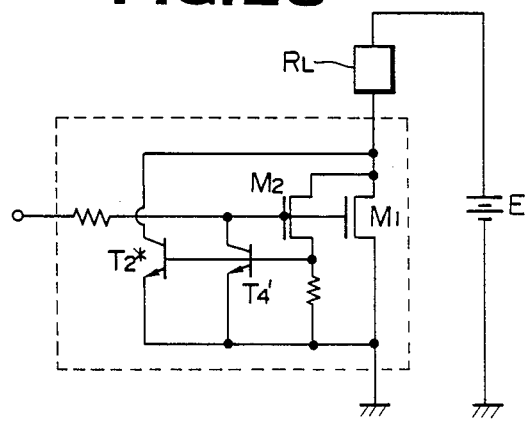

For comparison with the structure of T$_4$ shown in FIG. 21, FIG. 22 shows a lateral bipolar transistor structure having only a single base region. The bipolar transistor T$_4$' of FIG. 22 has a p-type single base region 112 formed in the n upper substrate layer 2 of the semiconductor substrate, and n+-type collector and emitter regions 111 and 114, formed in the base region 112. There is further formed a p+ base contact region 113. In this structure of FIG. 22, it is not possible to sufficiently reduce h$_{FE}$ of a parasitic bipolar transistor T$_2$* formed vertically as shown in FIG. 22. Therefore, as shown in an equivalent circuit of FIG. 23, the parasitic bipolar transistor T$_2$* is connected between the drain and source of the main MOSFET M$_1$.

In case of overcurrent, this parasitic transistor T$_2$* is turned on together with the intended transistor T$_4$' because both transistors share the base. Therefore, the current readily destroys the device by concentrating in the parasitic transistor T$_2$* instead of flowing through the main and current mirror MOSFETs M$_1$ and M$_2$.

In contrast, the bipolar transistor structure T$_4$ shown in FIGS. 16 and 21 is free from such a problem of parasitic transistor. In this lateral bipolar transistor T$_4$, the base width is made short, and the part of the second base region 121 which is lowered in concentration by the collector region 123 is used as a substatial base. Furthermore, this lateral bipolar transistor T$_4$ employs the two layer base structure consisting of the second base region 121 of a higher impurity concentration, and the first base region 120 which is lower in impurity concentration but deeper from the semiconductor substrate surface. Therefore, it is possible to remarkably reduce h$_{FE}$ of the parasitic bipolar transistor.

In the sixth embodiment, it is possible to employ the modification of FIG. 17, and the variations of FIGS. 18, 19A and 19B in the same manner as in the fifth embodiment.

Figure 24A:
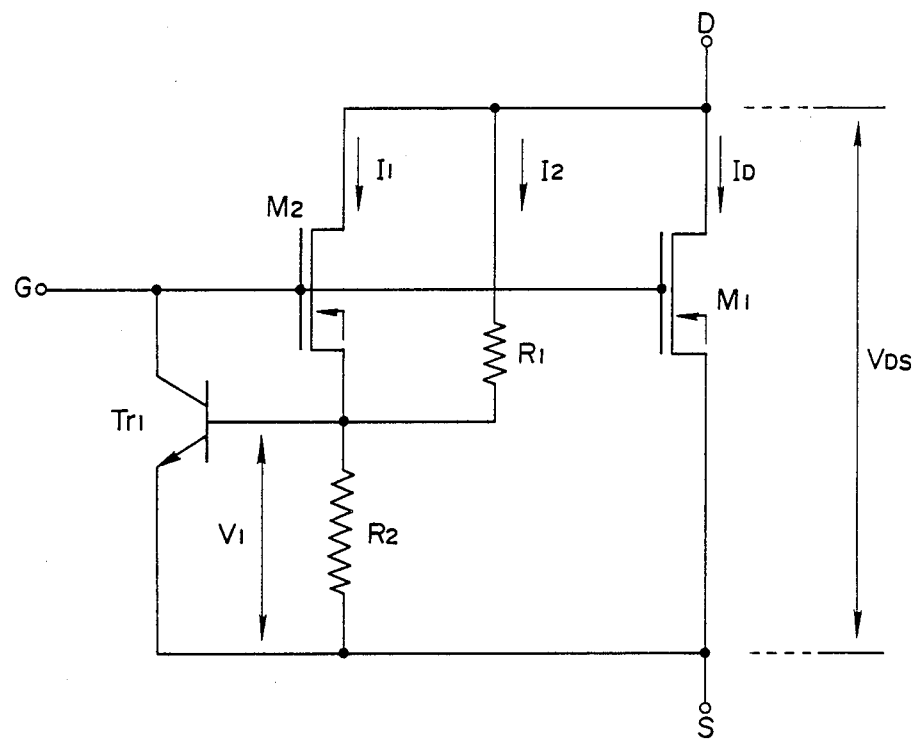
FIGS. 24A and 24B are, respectively, circuit diagram and graph showing arrangement and function of a MOSFET device of a seventh embodiment.
Figure 24B:
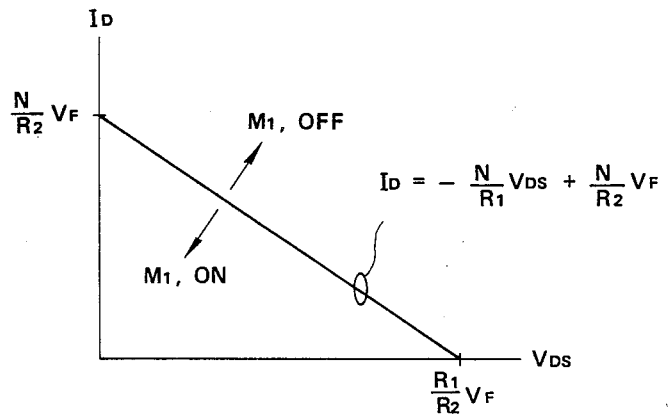

A SEVENTH EMBODIMENT of the present invention is shown in FIG. 24A and 24B.

Figure 25A:
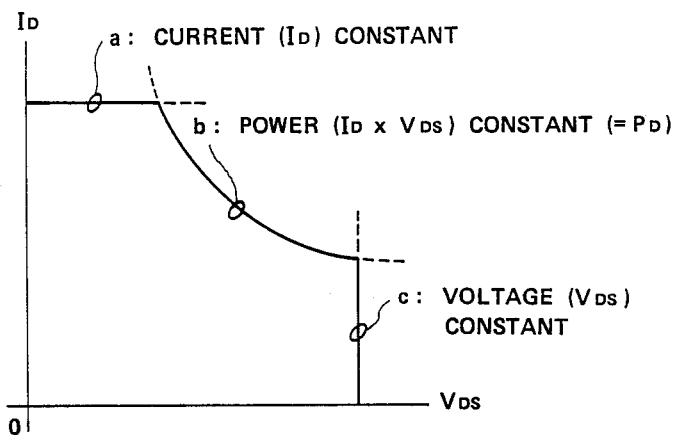
FIG. 25A is a graph showing ASO (Area of Safety Operation) of a power transistor.

To facilitate understanding of the seventh embodiment, reference is first made to ASO (Area of Safety Operation) of a power transistor shown in FIG. 25A.

In the graph of FIG. 25A, the drain current I$_D$ is expressed along the vertical axis, and the drain-source voltage V$_{DS}$ is expressed along the horizontal axis. In FIG. 25A, the safe operating area of the transistor is bounded by a horizontal solid line "a" along which the current I$_D$ is constant, a curved solid line "b" along which the power I$_D \times V_{DS}$ is constant and a vertical solid line "c" along which the voltage V$_{DS}$ is constant.

The line a is a boundary defined by a maximum current value. An area above the line a is an excessive current area. The line b is a boundary defined by a maximum value of the power consumption in the chip. The power is excessive in an area beyond the line b. In the area beyond the line b, the power dissipation is excessive, so that the device is overheated. Thus, the line b is not only the boundary of the excessive power area, but also the boundary of the excessive temperature area. The line c which is defined by a maximum voltage value is a boundary between the safe operating area and an overvoltage area.

In this way, the safe operating area of a power transistor is determined by three conditions of current, power and voltage. In order to obtain a transistor having maximum capabilities near the limit of the safe operating area, it is desirable to make the protective function as close to the characteristic of FIG. 25A as possible.

The seventh embodiment device shown in FIGS. 24A has the main MOSFET M$_1$ for driving a load, and the monitor MOSFET M$_2$ for current mirror, as in the preceding embodiments. The number of cells of M$_1$ is much greater than the number of cells of M$_2$. The current is divided between M$_1$ and M$_2$ according to the ratio N of the number of cells of M$_1$ to that of M$_2$ as in the preceding embodiments.

The device further includes a first resistor R$_1$ for sensing a drain voltage V$_{DS}$, and a second resistor R$_2$ connected between the source of the main MOSFET M$_1$ and a branch point at which the first resistor R$_1$ and the source of the current mirror MOSFET M$_2$ are connected together. The first resistor R$_1$ is connected between the drain and source of M₂. A bipolar transistor Tr₁ is connected between the gate and source of the main MOSFET M₁. The second resistor R₂ is connected between the base and emitter of Tr₁ so that the voltage across the resistor R₂ is applied between the base and emitter of Tr₁. The gates of the main and current mirror MOSFETs M₁ and M₂ are connected together.

The seventh embodiment device is operated as follows:

A drain current I₁ of M₂ is 1/N of the drain current $I_D$ of M₁. Under the condition that R₁ is much greater than R₂ (R₁>>R₂), a current I₂ through the resistor R₁ is proportional to the drain-source voltage $V_{DS}$ of the main MOSFET M₁, and given by $I_2 = V_{DS}/R_1$.

On the other hand, the current flowing through the second resistor R₂ is equal to the sum (I₁+I₂) of I₁ and I₂. The voltage V₁ across R₂ is given by;

$$V_1 = R_2(I_1 + I_2) = R_2\left(\frac{I_D}{N} + \frac{V_{DS}}{R_1}\right) \quad (1)$$

By this voltage V₁, the base-emitter junction of Tr₁ is forward biased. If the voltage V₁ rises and exceeds a predetermined voltage $V_F$ (≃0.6 V), the transistor Tr₁ turns on, so that a gate-source voltage $V_{GS}$ becomes approximately equal to $V_F$ ($V_{GS} \simeq V_F$), and the MOSFETs M₁ and M₂ are turned off.

FIG. 24B shows the condition that $V_1 \geq V_F$. In an area above a solid line of operating characteristic shown in FIG. 24B, $V_1 > V_F$, so that Tr is on and M₁ is off.

The operating characteristic line shown in FIG. 24B is given by;

$$I_D = -\frac{N}{R_1} V_{DS} + \frac{N}{R_2} V_F \quad (2)$$

In the equation (2), R₁, R₂, N and $V_F$ are constant. Therefore, by using A for $-N/R_1$ and B for $N/R_2$, i.e., $$-\frac{N}{R_1} = A, \frac{N}{R_2} = B,$$

the equation (2) is rewritten as;

$$I_D = A \times V_{DS} + B \quad (3)$$

where A is a negative constant, and B is a positive constant.

Figures 25B, 25C, 25D:
FIG. 25B is a graph showing a function of the device of FIG. 24A in relation to ASO.
FIG. 25C is a graph showing functions of devices shown in FIGS. 26A, 27A, and 28A.
FIG. 25D is a graph showing a function of a device shown in FIG. 29A.

FIG. 25B shows the relation between the operating characteristic line of the seventh embodiment and ASO. In FIG. 25B, ASO is shown by a solid line, and the operating characteristic is shown by a broken line.

In order to use the protective means of the seventh embodiment as a protection against excessive power, it is necessary to set the operating characteristic line below ASO. This requirement is expressed by a maximum value of the product $I_D \times V_{DS}$ on the operating characteristic line, and a maximum permissible power dissipation $P_D$ of the power MOSFET as follows:

$$P_D \geq N \times R_1/4R_2^2 \quad (4)$$

In the seventh embodiment device, it is possible to set the operating characteristic line freely within a range satisfying the condition (4), by choosing the values of R₁ and R₂ appropriately.

By using A and B, the maximum value of $I_D \times V_{DS}$ on the operating characteristic line is expressed as $-B^2/4A$. Therefore, the expression (4) is rewritten as;

$$P_D \geq -B^2/4A \quad (5)$$

It is easy to accurately control the predetermined voltage $V_F$ of the bipolar transistor Tr₁. Therefore, the seventh embodiment device can operate very accurately in spite of its relatively simple construction. The seventh embodiment can provide a low-cost MOSFET device having an overpower protection without requiring a complicated and large-sized IC structure.

Figure 26:
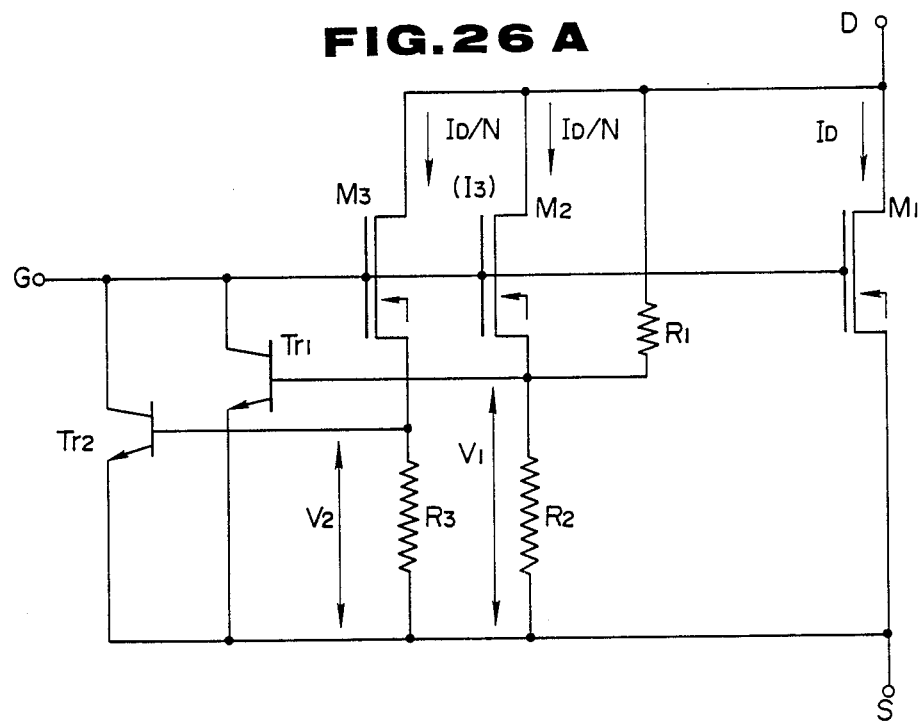
FIGS. 26A and 26B show an eighth embodiment.
Figure 26:
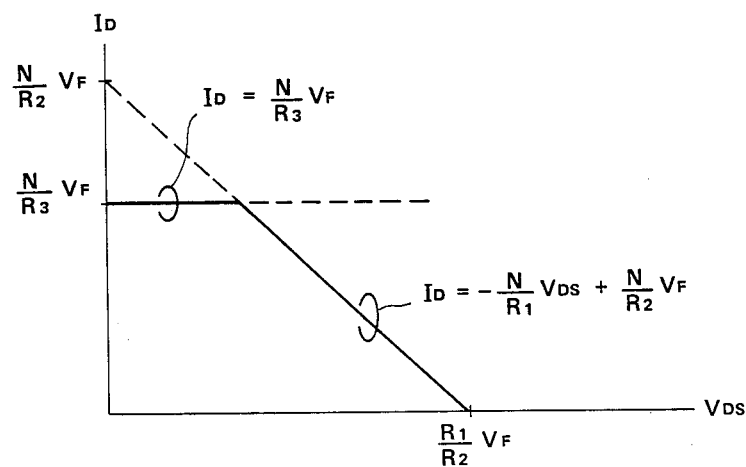

AN EIGHTH EMBODIMENT of the present invention is shown in FIGS. 26A and 26B. In the eighth embodiment, an overcurrent protection is added to the overpower protection of the seventh embodiment.

In the MOSFET device of FIG. 26A, an overcurrent protective section is composed of a third MOSFET M₃, a third resistor R₃ and a second bipolar transistor Tr₂. Like the MOSFET M₂, the third MOSFET M₃ is a current mirror MOSFET of the main MOSFET M₁. A current I₃ flowing through the third MOSFET M₃ is proportional to $I_D$ flowing through M₁. In this embodiment, the number n₃ of cells of M₃ is equal to the number n of cells of M₂. However, it is optional to employ the structure in which n₃ is not equal to n₂.

The drain electrodes of M₁, M₂ and M₃ are connected together to the drain terminal D of the device. The gate electrodes of M₁, M₂ and M₃ are connected together to the gate terminal G. As in the seventh embodiment, the first resistor R₁ is connected between the drain terminal and the source electrode of the M₂. The second resistor R₂ is connected between the source electrode of M₂ and the source terminal S of the device.

The third resistor R₃ is connected between the source electrode of M₃ and the source terminal S of the device. Each of the first and second bipolar transistors Tr₁ and Tr₂ is connected between the gate and source of the main MOSFET M₁. The third resistor R₃ is connected between the base and emitter of the second bipolar transistor Tr₂ so that the voltage across the third resistor R₃ is applied between the base and emitter of Tr₂. The second resistor T₂ is connected between the base and emitter of Tr₁ as in the seventh embodiment.

The eighth embodiment device is operated as follows:

When the current I₃ flows through the third resistor R₃, and the voltage V₂ across the third resistor R₃ exceeds $V_F$, then the second bipolar transistor Tr₂ is turned on, so that all of the three MOSFETs M₁, M₂ and M₃ are turned off.

The operating area of the eighth embodiment is shown by a solid line in FIG. 26B. In the eighth embodiment, as shown in FIG. 26B, if $$I_D \geq N \times V_F/R_3,$$

then the protective function is performed independent of $V_{DS}$.

The characteristic of the eighth embodiment is shown by a broken line in FIG. 25C. The eighth embodiment can provide a protection with respect to the overcurrent line a, in addition to the protection with respect to the overpower line b.

Figure 27A:
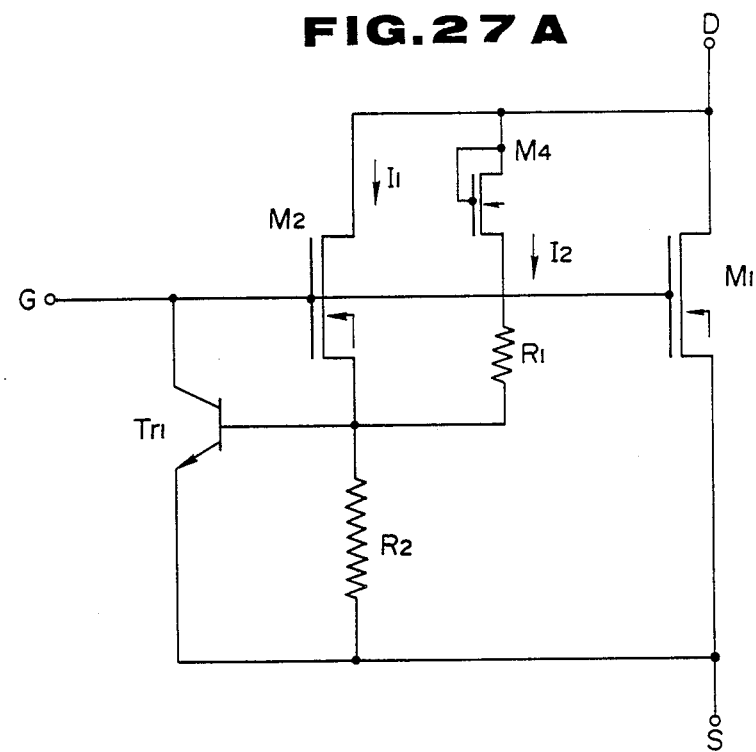
FIGS. 27A and 27B show a ninth embodiment.
Figure 27B:
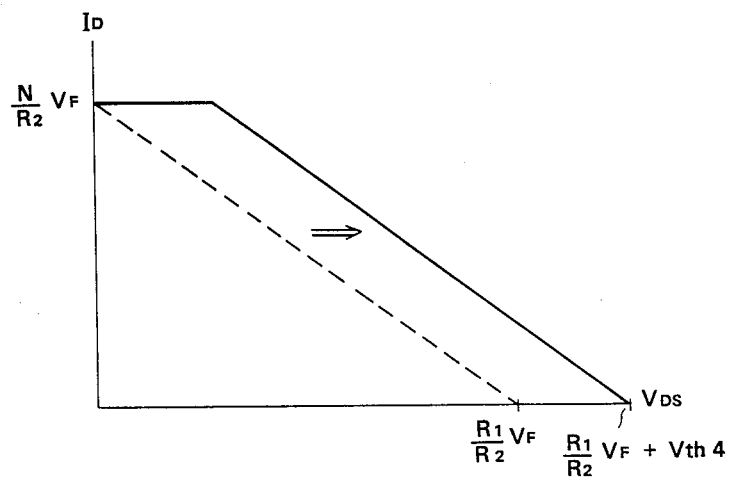

A NINTH EMBODIMENT of the present invention is shown in FIGS. 27A and 27B. The device of the ninth embodiment combines an overcurrent protection with an overpower protection, as in the eighth embodiment.

The circuit of FIG. 27A is different from the circuit of 24A of the seventh embodiment only in the addition of a MOSFET $M_4$. The MOSFET $M_4$ is connected between the drain electrode of the main MOSFET $M_1$ and the first resistor $R_1$. The gate and drain of $M_4$ are connected together.

In the device of FIG. 27A, the current $I_2$ does not flow until the voltage applied between the drain and source of the MOSFET $M_4$ becomes equal to or greater than a threshold voltage $V_{th4}$ of $M_4$. The current $I_2$ is given by;

$$I_2 = (V_{DS} - V_{th4})/R_1$$

Therefore, the operating area shown by a solid line in FIG. 27B is obtained. The ninth embodiment can provide the protective function shown by the broken line in FIG. 25C like the eighth embodiment of FIG. 26A.

Figure 28A:
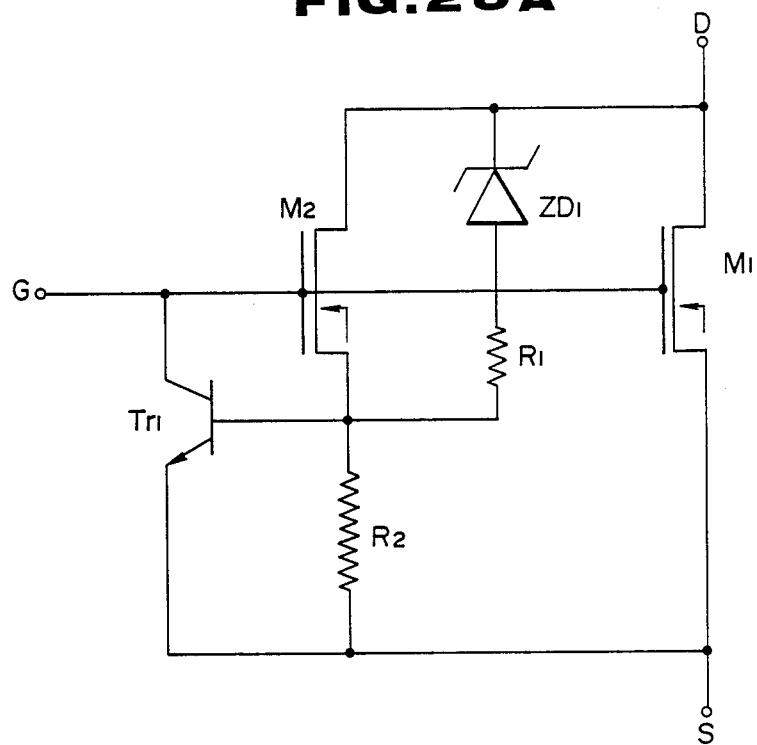
FIGS. 28A and 28B show a tenth embodiment.
Figure 28B:
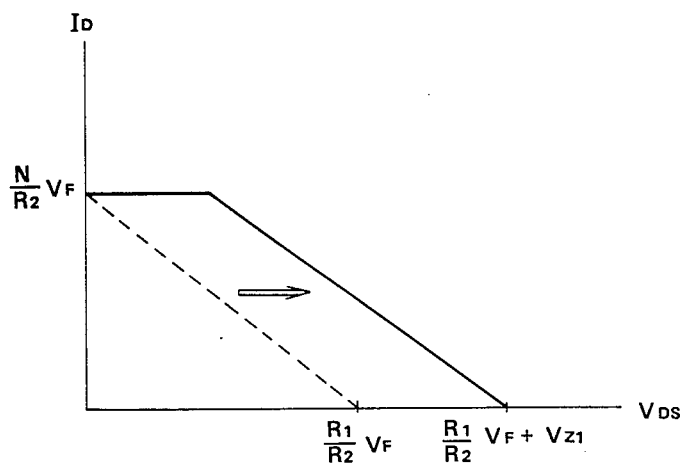

A TENTH EMBODIMENT of the present invention is shown in FIGS. 28A and 28B. The device of the tenth embodiment also combines the overcurrent protection and the protection against excessive power.

The circuit of FIG. 28A is the same as the circuit of FIG. 27A except that a zener diode $ZD_1$ is used in place of the MOSFET $M_4$. A cathod of the zener diode $ZD_1$ is connected with the drain electrode of the main MOSFET $M_1$. An anode of $ZD_1$ is connected with one end of $R_1$.

The operation of the tenth embodiment is similar to that of the ninth embodiment shown in FIGS. 27A and 27B. The operating characteristic of the tenth embodiment is shown by a solid line in FIG. 28B. In FIG. 28B, a horizontal $V_{DS}$ axis intercept of the solid line is greater than that of the broken line by a zener voltage $V_{Z1}$ of the zener diode $ZD_1$. The tenth embodiment can provide the protective function shown by the broken line in FIG. 25C.

Figure 29A:
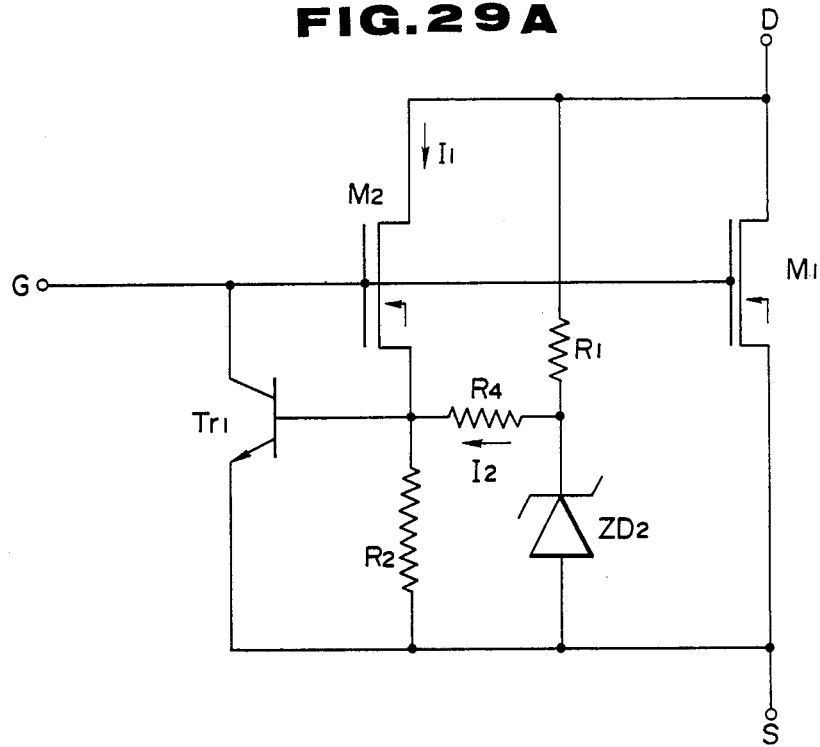
FIGS. 29A and 29B show an eleventh embodiment.
Figure 29B:
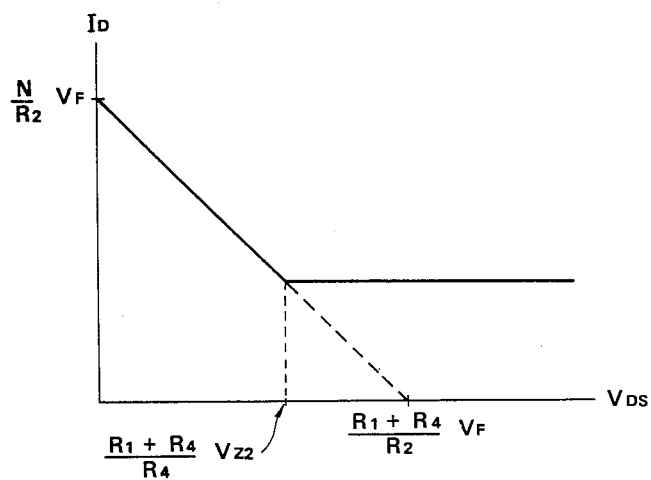

AN ELEVENTH EMBODIMENT of the present invention is shown in FIGS. 29A and 29B. In this embodiment, a resistor $R_4$ and a zener diode $ZD_2$ are added to the circuit of FIG. 24A.

As shown in FIG. 29A, the resistor $R_1$ is connected between the drain terminal D and a first branch point, and the zener diode $ZD_2$ is connected between the first branch point and the source terminal S. The resistor $R_4$ is connected between the first branch point and a second branch point lying between the source of $M_2$ and the resistor $R_2$.

In FIG. 29B, $V_{Z2}$ is a zener voltage of $ZD_2$. In the eleventh embodiment device, the current $I_2$ is fixed at $I_2 = V_{Z2}/R_4$ in the range in which;

$$V_{DS} > \frac{R_1 + R_4}{R_4} V_{Z2}$$

Therefore, the operating area shown by a solid line in FIG. 29B is obtained.

The relation between the characteristic of the eleventh embodiment and ASO is shown in FIG. 25D. The protective arrangement of the eleventh embodiment functions as a protection against excessive power like the protection shown in FIG. 25B. In the seventh embodiment, however, it is possible to adjust the protective function more precisely in agreement with the maximum permissible power dissipation curve b.

Figures 25E, 25F:
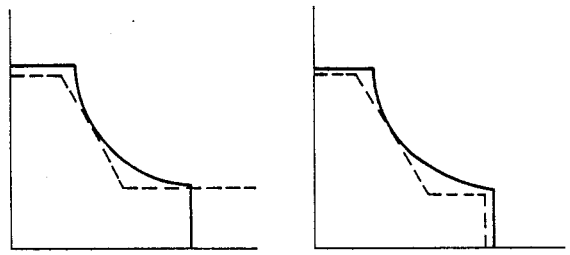
FIG. 25E is a graph showing a function of a device of FIG. 30A.
FIG. 25F is a graph showing a function of a device of FIG. 31A.
Figure 30:
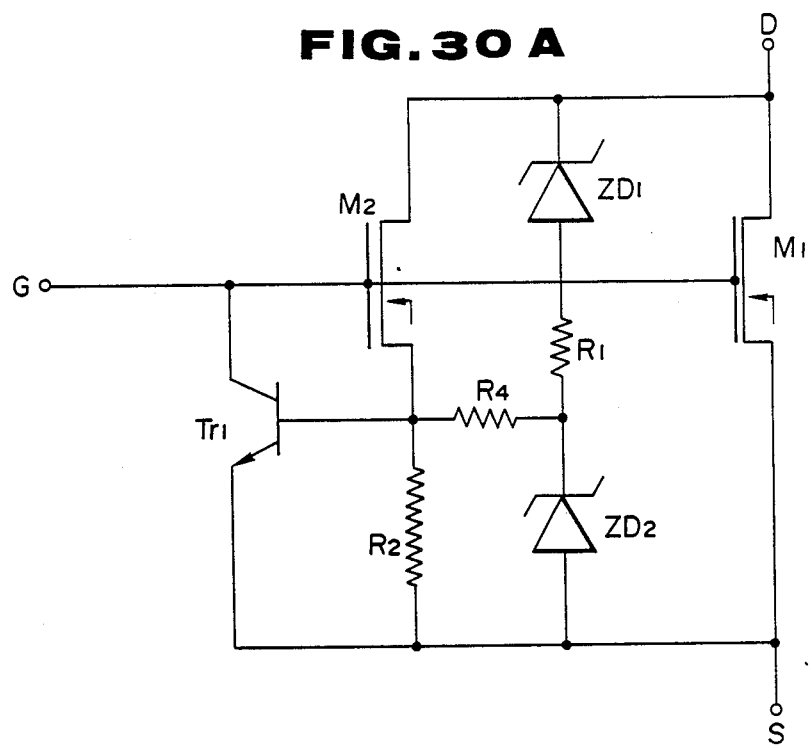
FIGS. 30A and 30B show a twelfth embodiment.
Figure 30:
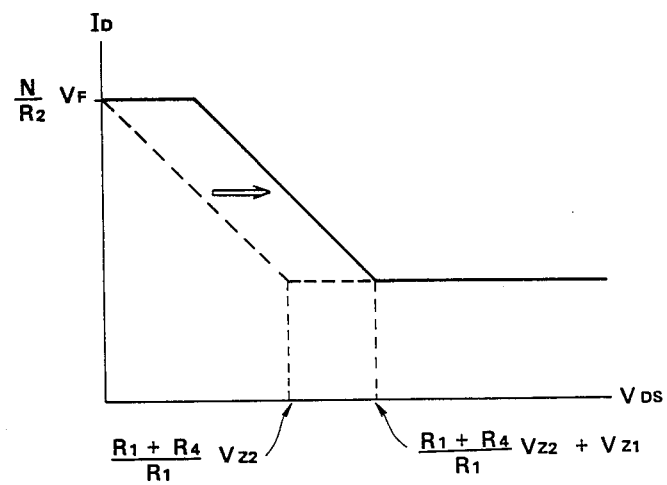

A TWELFTH EMBODIMENT of the present invention is shown in FIGS. 30A and 30B. The device of the twelfth embodiment combines the feature of the tenth embodiment shown in 28A and the feature of the eleventh embodiment shown in FIG. 29A. In FIG. 30B, a solid line shows the operating area obtained by the twelfth embodiment. The relation of the characteristic of this embodiment with respect to ASO is shown in FIG. 25E. The twelfth embodiment can provide overcurrent protection and overpower protection which are precisely conformed to the ASO boundaries.

Figure 31A:
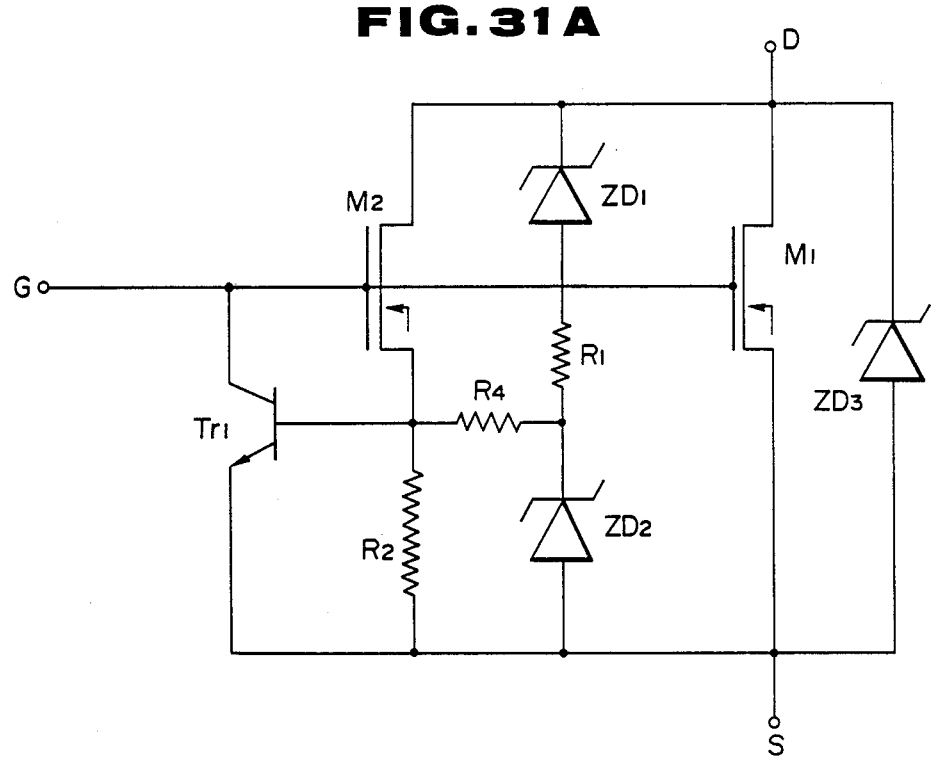
FIGS. 31A and 31B show a thirteenth embodiment.
Figure 31B:
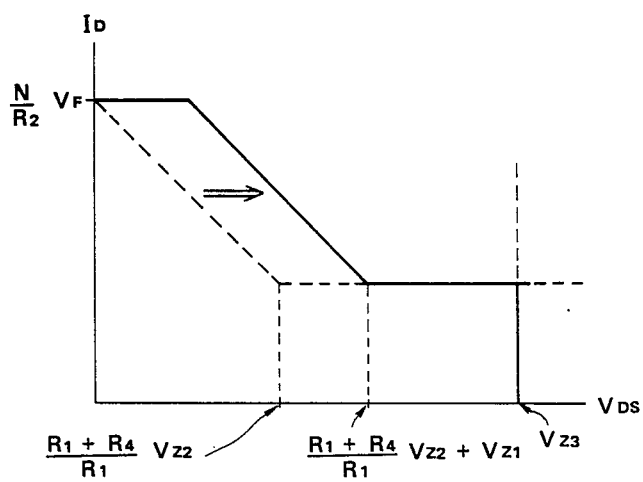

A THIRTEENTH EMBODIMENT of the present invention is shown in FIGS. 31A and 31B. The device of this embodiment has an overvoltage protection in addition to the overcurrent protection and the overpower protection.

In the circuit shown in FIG. 31A, a third zener diode $ZD_3$ is added to the circuit of FIG. 30A. The third zener diode $ZD_3$ is connected between the source and drain of the main MOSFET $M_1$.

In this embodiment, a zener voltage of the third zener diode $ZD_3$ is set at a value equal to or lower than a breakdown voltage $BD_{DS}$ of the main MOSFET $M_1$. Therefore, the main MOSFET $M_1$ is protected from damage due to breakdown even if a voltage above the breakdown voltage is applied between the drain and source of $M_1$.

The operating characteristic of the thirteenth embodiment is shown by a solid line in FIG. 31B, and the relation with ASO is shown in FIG. 25F.

The thirteenth embodiment can provide the protection effective against all of the three factors of ASO, i.e. excessive current power and voltage.

Because the third zener diode $ZD_3$ directly clamps the drain-source voltage $V_{DS}$ of the main MOSFET $M_1$, the third zener diode $ZD_3$ must have a very large capacity as compared with the zener diodes $ZD_1$ and $ZD_2$. A method disclosed in Japanese patent provisional publication No. 59-98557 is helpful for forming the third zener diode $ZD_3$ of such a large capacity between the source and drain of the MOSFET $M_1$.

Figure 32A:
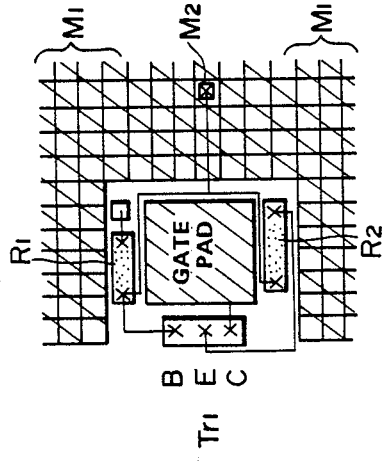
FIGS. 32A and 32B are plan view and cross section showing a structure employed in each of the embodiments shown in FIGS. 24A-31B.
Figure 32B:
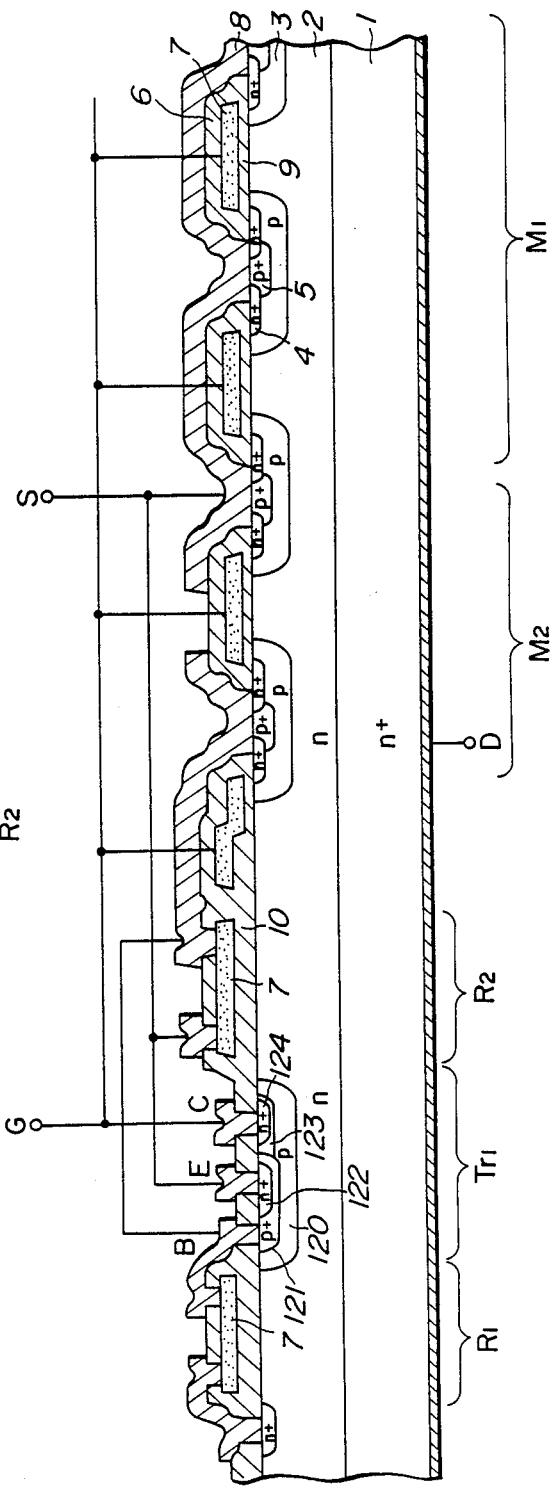

A main portion of the device of each of the seventh to thirteenth embodiments is shown in FIGS. 32A and 32B. The main and current mirror MOSFETs $M_1$ and $M_2$, the bipolar transistor $Tr_1$, and the resistors $R_1$ and $R_2$ are formed in and on the same semiconductor substrate. The MOSFETs $M_1$ and $M_2$ are constructed in the same manner as shown in FIGS. 5A and 5B. Each of the resistors $R_1$ and $R_2$ is a polysilicon film resistor formed above and insulated from the substrate in the same manner as shown in FIGS. 2B or 15. It is possible to form the resistors $R_3$ and $R_4$ in the same manner. The bipolar transistor $Tr_1$ of this example is constructed in the same manner as shown in FIGS. 16 or 21. It is possible to form the bipolar transistor $Tr_2$ in the same manner.

In each of the embodiments shown in FIGS. 24A–31B, a protection against overheating is achieved with a very simple protective arrangement without requiring any means for temperature detection. Furthermore, this protective arrangement is easy to fabricate and suitable for integration with a main power MOSFET and for size reduction of an IC chip.

Figure 33:
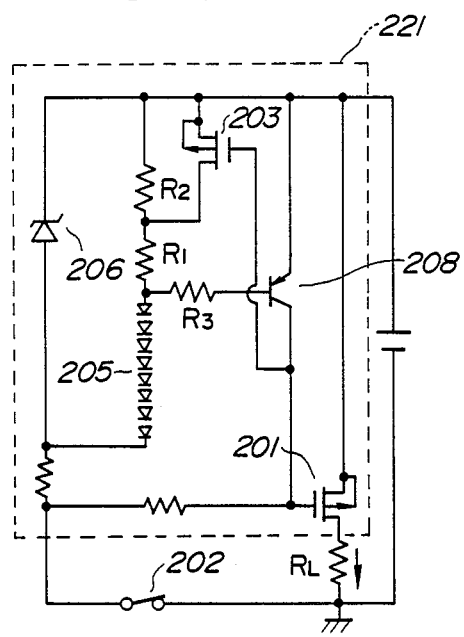
FIG. 33 is a circuit diagram showing a device of a fourteenth embodiment.

A FOURTEENTH EMBODIMENT of the present invention is shown in FIG. 33. In this embodiment, the bipolar transistor structure shown in FIG. 21 is used for a thermal protection.

Figure 39:
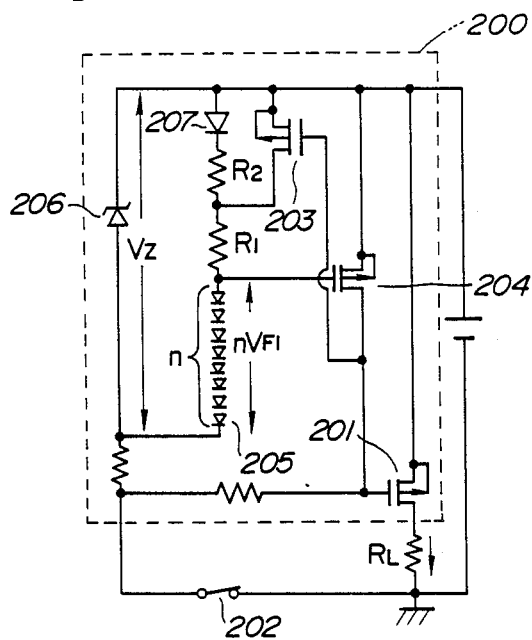
FIG. 39 is a circuit diagram showing a conventional power MOSFET device having a thermal protection.

FIG. 39 shows a conventional example of a thermal protective circuit (as disclosed in Denso Gijutsu Kai Kaiho vol. 30, no. 4, pages 17–23).

A power MOSFET device 200 shown by a broken line in FIG. 39 is in the form of a single chip. In this example, a p channel power MOS 201 is employed.

A switch 202 is connected with the device 200 for turning on and off the power MOS 201. In addition to the power MOS 201, the device 200 includes first and second control MOSFETs 203 and 204, a temperature sensing diode string 205 consisting of a plurality of diodes connected in series, a zener diode 206, resistors $R_1$ and $R_2$ and other components.

When the switch 202 is switched on, a low level signal is applied to he gate of the power MOS 201, and the power MOS 201 is turned on. In this case, the first control MOSFET 203 is turned on simultaneously with the power MOS 201 because the gates of both transistors are connected together. If we neglect the on resistance of the first control MOSFET 203, we can consider that a current flowing through the diode string 205 is determined by the resistance $R_1$. At the thus-determined current value, each diode of the diode string 205 has a forward voltage $V_{F1}$, and a voltage between both ends of the diode string 205 amounts to $nV_{F1}$ where n is the number of the diodes of the diode string 205. Therefore, a gate source voltage of the second control MOSFET 204 is expressed as $V_Z - nV_{F1}$ where $V_Z$ is a zener voltage of the zener diode 206.

When the temperature is normal, the voltage $V_{F1}$ is so high that the gate source voltage of the MOSFET 204 is lower than a threshold voltage $V_{th}$ of the MOSFET 204. That is, $V_{th} > (V_Z - nV_{F1})$. Therefore, the second control MOSFET 204 remains off.

In the temperature sensing diode string 205, the forward voltage $V_{F1}$ decreases with increase in temperature. Therefore, if the temperature of the chip increases abnormally because of an excessive increase in the voltage or current which the power MOS 201 handles, or by some other reason, then the gate source voltage $V_Z - nV_{F1}$ of the second control MOSFET 204 increases, and y exceeds the threshold voltage $V_{th}$. For example, the gate source voltage $V_Z - nV_{F1}$ becomes higher than $V_{th}$ when the temperature reaches 150° C. As a result, the second control MOSFET 204 is turned on, and causes the power MOS 201 to turn off by applying a high level signal to the gate of the power MOS 201. Thus, the protective device of this example protects the device against overheating.

The first control MOSFET 203 is turned off simultaneously with the powr MOS 201. Therefore, the current through the diode string 205 is decreased by being limited by the resistance $R_1 + R_2$. With this decrease of the current, the forward voltage of the diode string 205 is decreased to a lower value $V_{F2}$, and the gate source voltage of the second control MOSFET 204 is increased from $(V_Z - nV_{F1})$ to $(V_Z - nV_{F2})$. Therefore, the on state of the second MOSFET 204 becomes more stable.

After a while, the chip temperature decreases, and accordingly, the forward voltage $V_{F2}$ of the diode string 205 increases. When the chip temperature decreases to a sufficient low value (, for example, 110° C.) at which the gate source voltage $(V_Z - nV_{F2})$ becomes lower than $V_{th}$, then the second control MOSFET 204 turns off, so that the power MOS 201 is turned on again.

The first control MOSFET 203 is used for obtaining the characteristic of hysteresis. The first control MOSFET 203 adds the effect of temperature hysteresis by changing the current value through the diode string 205.

This conventional device employs MOSFETs as transistors for controlling the power MOS 201 in accordance with temperature. However, the threshold voltage $V_{th}$ of a MOSFET is difficult to control, and the dispersion of values of $V_{th}$ in fabrication is as wide as ±0.5 V. Therefore, it is difficult to accurately control the actuating temperature of the thermal protective circuit.

Another conventional example is disclosed in Electronics, June 28, 1984, pages 134–136. This example employs a comparator to improve the accuracy of temperature detection. However, the structure of this conventional device is so complicated and large-sized that the fabrication is not easy, and the cost and chip size are increased.

The fourteenth embodiment solves these problems by using the bipolar transistor structure shown in FIG. 21.

FIG. 33 shows an equivalent circuit of the fourteenth embodiment device 201. In this device, a bipolar transistor 208 is employed in place of the second control MOSFET 204 of FIG. 39. The diode 207 shown in FIG. 39 is removed, and a curent limiting resistor $R_3$ is connected with the base of the bipolar transistor 208 because the threshold voltage of the bipolar transistor is low. In other respects, the device 201 is substantially the same as the conventional device of FIG. 39.

The device 201 is operated in the same manner as the conventional device 200 except that the function of the second control MOSFET 204 is performed by the bipolar transistor 208.

Unlike the conventional device 200, the fourteenth embodiment device 201 can improve the accuracy of the temperature value because it is easy to accurately control the threshold voltage of the bipolar transistor as compared with the MOSFETs, and the dispersion of the threshold voltage of the bipolar transistor is as small as several mV.

The bipolar transistor 208 has the structure shown in FIG. 21, so that the problem of a parasitic transistor can be solved as mentioned before. It is optional to employ either of the bipolar transistor structures shown in FIGS. 18 and 19A as the transistor 208 instead of the structure of FIG. 21.

Figure 34:
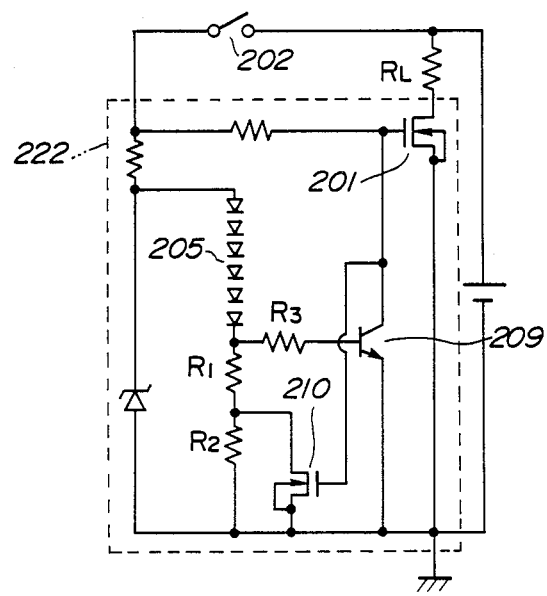
FIG. 34 is a circuit diagram showing a variation of the fourteenth embodiment.

FIG. 34 shows a variation of the fourteenth embodiment. In this example, an n channel MOS is used as the power MOS 201 instead of a p channel MOS.

Because the polarity of the power MOS is opposite to that of the device 201 shown in FIG. 33, a device 202 of FIG. 34 employs a bipolar transistor 209 of an opposite polarity in place of the bipolar transistor 208, and a MOSFET 210 of an opposite polarity in place of the MOSFET 203, and the circuit is arranged upside down. However, the device 202 is operated in an analogous manner, and has the same advantages. Because an n channel MOS is employed as the power MOS 201, it is possible to further reduce the chip size as compared with the p channel MOS device 201 of FIG. 33.

What is claimed is:

1. A MOSFET device comprising
a main MOSFET component having source, drain and gate electrodes,
a protective circuit having a monitor MOSFET component having a gate electrode, a source electrode and a drain electrode which is connected with said drain electrode of said main MOSFET component, a monitor resistor connected between said source electrodes of said main and monitor MOSFET components, a first branch connecting said gate electrodes of said main and monitor MOSFET components, and a protective transistor having a first electrode connected with said gate electrode of said main MOSFET component, a second electrode and a control electrode connected with a node between said monitor resistor and said source electrode of said monitor MOSFET component.

2. A MOSFET device according to claim 1 wherein said main and monitor MOSFET components are formed in a semiconductor substrate, which is formed with a plurality of cells each forming a vertical MOSFET element, a major part of said cells being arranged to form said main MOSFET component, and a minor part of said cells being arranged to form said monitor MOSFET component.

3. A MOSFET device according to claim 2 wherein said protective circuit is integrated with said main MOSFET component into an integrated circuit.

4. A MOSFET device according to claim 2 wherein said device further comprises a grounded source terminal to which said source electrode of said main MOSFET component is connected, and a drain terminal which is connected with said drain electrodes of said main and monitor MOSFET components, and adapted to be connected with a load.

5. A MOSFET device according to claim 2 wherein said second electrode of said protective transistor is connected with said source electrode of said main MOSFET.

6. A MOSFET device according to claim 5 wherein said protective transistor is a field effect transistor, whose gate electrode is said control electrode.

7. A MOSFET device according to claim 6 wherein said protective transistor is a metal gate FET.

8. A MOSFET device according to claim 6 wherein said protective transistor is a junction FET.

9. A MOSFET device according to claim 6 wherein said protective transistor is formed in a semiconductor film which is formed on an insulating layer on said semiconductor substrate.

10. A MOSFET device according to claim 9 wherein said protective transistor is formed in a polysilicon film formed above and insulated from said semiconductor substrate, said monitor resistor is a film resistor formed in a polysilicon layer which is formed above and insulated from said semiconductor substrate, and each of said gate electrodes of said main and monitor MOSFET components is a polysilicon layer formed above and insulated from said semiconductor substrate.

11. A MOSFET device according to claim 5 wherein said first branch includes a gate separating resistor interposed between said gate electrodes of said main and monitor MOSFET components.

12. A MOSFET device according to claim 6 wherein said protective transistor is an n channel MOSFET formed in a polysilicon layer which is formed above and insulated from said semiconductor substrate.

13. A MOSFET device according to claim 2 wherein said protective transistor is a p channel MOSFET whose gate electrode is said control electrode, and said second electrode of said protective transistor is connected with a gate terminal of said MOSFET device.

14. A MOSFET device according claim 5 wherein said protective transistor is a bipolar transistor having a base electrode which is said control electrode, a collector electrode which is said first electrode, and an emitter electrode which is said second electrode.

15. A MOSFET device according to claim 14 wherein said bipolar transistor is a polysilicon transistor comprising a polysilicon layer which is formed above and insulated from said semiconductor substrate.

16. A MOSFET device according to claim 14 wherein said bipolar transistor is a lateral bipolar transistor formed in said semiconductor substrate which comprises a top substrate layer of a first conductivity type, and said bipolar transistor comprises a first base region of a second conductivity type extending into said top substrate layer from a top surface of said semiconductor substrate, a second base region of said second conductivity type which extends into said first base region from said top surface and has an impurity concentration higher than that of said first base region, an emitter region of said first conductivity type extending into said second base region from said top surface, and a collector region of said first conductivity type which extends into said first base region from said top surface and touches said second base region.

17. A MOSFET device according to claim 16 wherein said monitor resistor is a semiconductor resistor formed in said first base region under said collector region.

18. A MOSFET device according to claim 2 wherein said protective circuit further comprises a drain voltage sensing resistor connected between said drain electrode of said main MOSFET component and said node between said monitor resistor and said source electrode of said monitor MOSFET component.

19. A MOSFET device according to claim 18 wherein said monitor resistor and said drain voltage sensing resistor are so chosen that a fraction whose numerator equals a product obtaind by multiplying a resistance of said drain voltage sensing resistor by a ratio of a number of said cells of said main MOSFET component to a number of said cells of said monitor MOSFET component and whose denominator equals four times the square of a resistance of said monitor resistor is equal to or lower than a maximum permissible power dissipation of said main MOSFET component.

20. A MOSFET device according to claim 19 wherein said protective circuit further comprises overcurrent protective means for turning off said main MOSFET component by decreasing a gate source voltage of said main MOSFET component irrespective of a drain source voltage of said main MOSFET component if a drain current of said main MOSFET component exceeds a predetermined value.

21. A MOSFET device according to claim 20 wherein said overcurrent protective means comprises a third MOSFET component whose drain electrode is connected with said drain electrode of said main MOSFET component, a third resistor connected between a source electrode of said third MOSFET component and said source electrode of said main MOSFET component, and a second transistor having a first electrode connected with said gate electrode of said main MOSFET component, a second electrode connected with said source electrode of said main MOSFET component, and a control electrode connected with a node between said third resistor and said source electrode of said third MOSFET component.

22. A MOSFET device according to claim 19 wherein said protective circuit further comprises a third field effect transistor which is connected between said drain electrode of said main MOSFET component and said drain voltage sensing resistor, and which has drain and gate electrodes which are connected together.

23. A MOSFET device according to claim 19 wherein said protective circuit further comprises a first zener diode connected between said drain electrode of said main MOSFET component and said drain voltage sensing resistor.

24. A MOSFET device according to claim 23 wherein said protective circuit further comprises a second zener diode which is connected between said drain voltage sensing resistor and said source electrode of said main MOSFET component and which has a cathode connected with said drain voltage sensing resistor and an anode connected with said source electrode of said main MOSFET component, and an additional resistor which is connected between said node between said monitor resistor and said source electrode of said monitor MOSFET component and a node between said drain voltage sensing resistor and said second zener diode.

25. A MOSFET device according to claim 24 wherein said protective circuit further comprises a third zener diode whose cathode is connected with said drain electrode of said main MOSFET component, and whose anode is connected with said source electrode of said main MOSFET component.

26. A MOSFET device according to claim 19 wherein said protective circuit further comprises a zener diode which is connected between said drain voltage sensing resistor and said source electrode of said main MOSFET component and which has a cathode connected with said drain voltage sensing resistor and an anode connected with said source electrode of said main MOSFET component, and an additional resistor which is connected between said node between said monitor resistor and said source electrode of said monitor MOSFET component and a node between said drain voltage sensing resistor and said zener diode.

27. A MOSFET device comprising
a main MOSFET component for driving a load, and
protective means comprising first means for sensing a drain source volta and a drain current $I_D$ of said main MOSFET component, and second means for turning off said main MOSFET component by decreasing a gate source voltage of said main MOSFET component if said drain source voltage $V_{DS}$ and said drain current $I_D$ satisfy a condition that said drain current $I_D$ is greater than a sum of a product obtained by multiplying said drain source voltage $V_{DS}$ by a first quantity A, and a second quantity B where said first quantity A is a negative constant and said second quantity B is a positive constant and said first and second quantity are so determined as to satisfy a condition that a fraction whose numerator equals minus said second quantity squared and whose denominator equals said first quantity multiplied by four is equal to or smaller than a maximum permissible power dissipation of said main MOSFET component.

28. A MOSFET device according to claim 27 wherein said protective means comprises overcurrent protective means for decreasing said gate source voltage $V_{GS}$ irrespectively of said drain source voltage $V_{DS}$ if said drain current $I_D$ is greater than a predetermined value.

29. A MOSFET device according to claim 27 wherein said protective means comprises third means for preventing a function of said second means in a voltage range in which said drain source voltage $V_{DS}$ is greater than a predetermined voltage value if said drain current $I_D$ is smaller than a predetermined current value, and allowing said second means to decrease said gate source voltage $V_{GS}$ in said voltage range if said drain current $I_D$ is greater than said predetermined current value.

30. A power MOSFET device comprising
a main MOSFET component of a vertical type having a top substrate layer of a first conductivity type, of a semiconductor substrate for serving as a drain region, a body region of a second conductivity type extending into said top substrate layer from a top surface of said top substrate layer, and a source region of said first conductivity type extending into said body region from said top surface, and
a bipolar transistor of a lateral type having a first base region of said second conductivity type extending into said top substrate layer from said top surface, a second base region of said second conductivity type which extends into said first base region from said top surface, has an impurity concentration higher than that of said first base region and serves as a base of said bipolar transistor, an emitter region of said first conductivity type extending into said second base region from said top surface, and a collector region of said first conductivity type extending into said first base region from said top surface and touching said second base region.

* * * * *